US012224312B2

(12) United States Patent
Frougier et al.

(10) Patent No.: US 12,224,312 B2
(45) Date of Patent: Feb. 11, 2025

(54) FIELD EFFECT TRANSISTORS WITH BOTTOM DIELECTRIC ISOLATION

(71) Applicant: International Business Machines Corporation, Armonk, NY (US)

(72) Inventors: Julien Frougier, Albany, NY (US); Ruilong Xie, Niskayuna, NY (US); Andrew M. Greene, Slingerlands, NY (US); Veeraraghavan S. Basker, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 288 days.

(21) Appl. No.: 17/411,597

(22) Filed: Aug. 25, 2021

(65) Prior Publication Data

US 2023/0060619 A1    Mar. 2, 2023

(51) Int. Cl.
*H01L 27/088*    (2006.01)
*H01L 21/8234*   (2006.01)
*H01L 29/06*     (2006.01)
*H01L 29/423*    (2006.01)
(Continued)

(52) U.S. Cl.
CPC .. *H01L 29/0649* (2013.01); *H01L 21/823418* (2013.01); *H01L 21/823431* (2013.01); *H01L 21/823481* (2013.01); *H01L 27/0886* (2013.01); *H01L 29/0673* (2013.01); *H01L 29/42392* (2013.01); *H01L 29/66795* (2013.01); *H01L 29/7851* (2013.01)

(58) Field of Classification Search
None
See application file for complete search history.

(56) References Cited

U.S. PATENT DOCUMENTS 8,912,606 B2    12/2014  Baldauf et al.
9,711,414 B2    7/2017   Hatcher et al.
9,761,722 B1    9/2017   Jagannathan et al.
(Continued)

FOREIGN PATENT DOCUMENTS

CN    106784001 A    5/2017
CN    107195581 A    9/2017
(Continued)

OTHER PUBLICATIONS

ZHANG et al., "Full Bottom Dielectric Isolation to Enable Stacked Nanosheet Transistor for Low Power and High Performance Applications", 2019 IEEE International Electron Devices Meeting (IEDM), IEDM19-250, 4 pages.
(Continued)

*Primary Examiner* — Joseph C. Nicely
*Assistant Examiner* — Lamont B Koo
(74) *Attorney, Agent, or Firm* — David K. Mattheis

(57) ABSTRACT

A semiconductor device fabricated by forming FET fins from a layered semiconductor structure. The layered semiconductor structure incudes a sacrificial layer. Further by forming dummy gate structures on the FET fins, recessing the FET fins between dummy gate structures, growing source-drain regions between FET fins and the sacrificial layer, replacing active region dummy gate structures with high-k metal gates structures, and replacing the sacrificial layer with a dielectric isolation material, wherein the dielectric isolation material extends across the active region.

10 Claims, 37 Drawing Sheets

(51) Int. Cl.
*H01L 29/66* (2006.01)
*H01L 29/78* (2006.01)

(56) References Cited

U.S. PATENT DOCUMENTS

| | | | |
|---|---|---|---|
| 9,905,643 B1 | 2/2018 | Bergendahl et al. | |
| 9,947,804 B1 | 4/2018 | Frougier et al. | |
| 9,984,936 B1* | 5/2018 | Xie | H01L 29/66439 |
| 10,020,398 B1 | 7/2018 | Cheng et al. | |
| 10,032,867 B1 | 7/2018 | Yeung et al. | |
| 10,170,638 B1 | 1/2019 | Reznicek | |
| 10,453,824 B1 | 10/2019 | Mochizuki | |
| 10,468,311 B2 | 11/2019 | Reznicek | |
| 10,665,669 B1* | 5/2020 | Xie | H01L 21/02381 |
| 2017/0278752 A1 | 9/2017 | Ryckaert | |
| 2018/0331184 A1 | 11/2018 | Glass | |
| 2019/0057867 A1 | 2/2019 | Smith | |
| 2019/0058052 A1 | 2/2019 | Frougier | |
| 2019/0081079 A1 | 3/2019 | Liu | |
| 2019/0229184 A1 | 7/2019 | Shank | |
| 2019/0280104 A1 | 9/2019 | Ma | |
| 2020/0105869 A1 | 4/2020 | Loubet | |
| 2020/0349314 A1* | 11/2020 | Ryu | H01L 21/823431 |
| 2022/0336457 A1* | 10/2022 | Tseng | H01L 29/42392 |
| 2022/0367670 A1* | 11/2022 | Lai | H01L 29/66553 |

FOREIGN PATENT DOCUMENTS

| | | |
|---|---|---|
| CN | 108541342 A | 9/2018 |
| CN | 109411352 A | 3/2019 |
| CN | 112908853 A | 6/2021 |
| JP | 2006501690 A | 1/2006 |

OTHER PUBLICATIONS

International Search Report and Written Opinion dated Aug. 9, 2022 from International Application No. PCT/CN2022/100796 filed Jun. 23, 2022.

* cited by examiner

FIELD EFFECT TRANSISTORS WITH BOTTOM DIELECTRIC ISOLATION

BACKGROUND

The disclosure relates generally to field effect transistor devices. The disclosure relates particularly to field effect transistor devices including full bottom isolation.

For Gate-All-Around (GAA) nanosheet devices formed on bulk substrate, source-drain epitaxial regions grow from both the device nanosheet channel edges and the bottom substrate. Mismatched crystalline lattices between the S/D regions the channel nanosheets, and the substrate enable the application of mechanic strains to the nanosheet channels, enhancing charge mobility within the channel nanosheets during device operations.

Parasitic S/D leakage currents through the substrate may be reduced or eliminated through the formation of bottom dielectric isolation regions below the S/D regions

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

In one aspect, a semiconductor device fabricated by forming FET fins from a layered semiconductor structure. The layered semiconductor structure incudes a sacrificial layer. Further by forming dummy gate structures on the FET fins, recessing the FET fins between dummy gate structures, growing source-drain regions between FET fins and the sacrificial layer, replacing active region dummy gate structures with high-k metal gates structures, and replacing the sacrificial layer with a dielectric isolation material, wherein the dielectric isolation material extends across the active region.

In one aspect, a semiconductor device includes an active region, and a dielectric isolation region disposed between the active region and an underlying semiconductor substrate, the dielectric isolation region further disposed vertically at an edge of the active region.

In one aspect, a method for fabricating a semiconductor device, the method including forming FET fins from a layered semiconductor structure, the layered semiconductor structure comprising a sacrificial layer, forming dummy gate structures on the FET fins, recessing the FET fins between dummy gate structures and into the sacrificial layer, growing a semiconductor layer upon the FET fins and the sacrificial layer, growing source-drain regions between the FET fins and the semiconductor layer, replacing active region dummy gate structures with high-k metal gates structures, and replacing the sacrificial layer with a dielectric isolation material, wherein the dielectric isolation material extends across the active region.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1A:
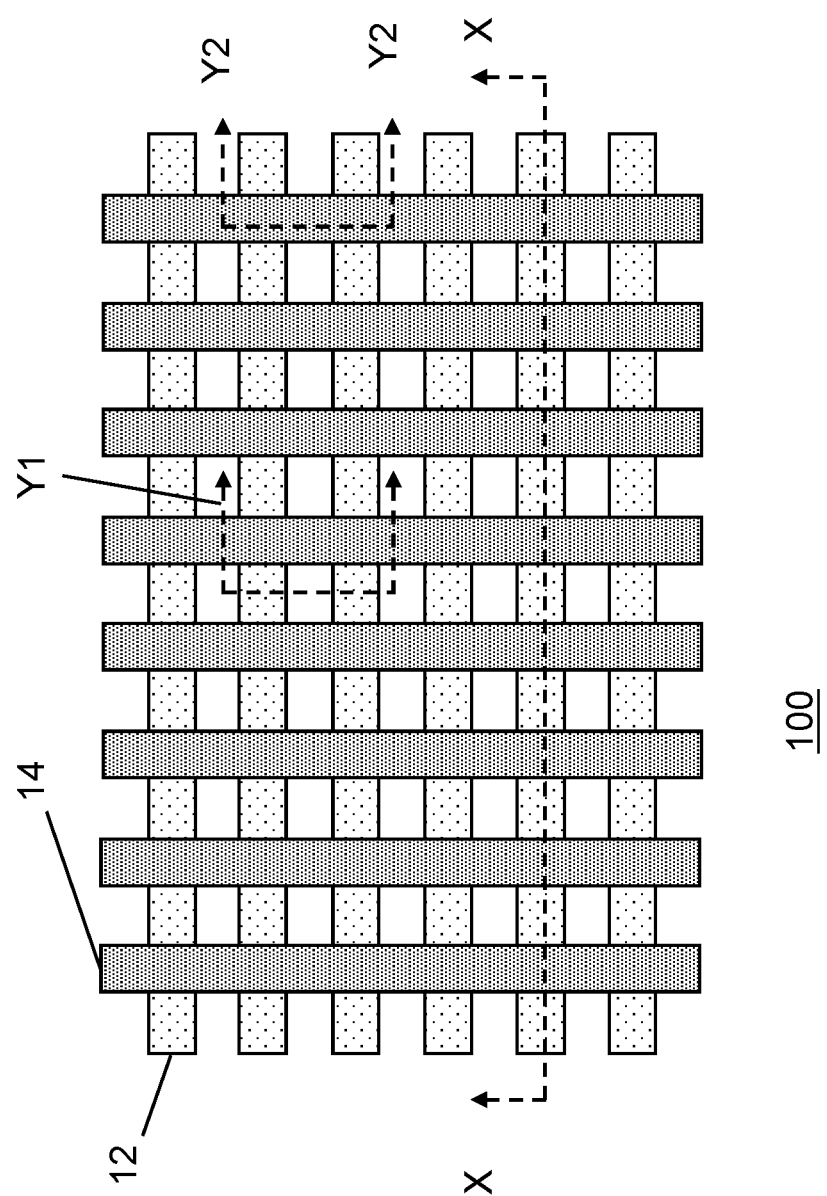
FIG. 1A provides a plan view of a semiconductor device, according to an embodiment of the invention. The figure illustrates the section lines used for the respective views of FIGS. 1-11.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Deposition processes for the metal liner and sacrificial material include, e.g., chemical vapor deposition (CVD), physical vapor deposition (PVD), atomic layer deposition (ALD), plasma enhanced atomic layer deposition (PEALD) or gas cluster ion beam (GCIB) deposition. CVD is a deposition process in which a deposited species is formed as a result of chemical reaction between gaseous reactants at greater than room temperature (e.g., from about 250° C. about 9000° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Counter-doping portions of the substrate below S/D areas to form punch-through regions may suppress the leakage currents, but success may be limited due to dopant diffusion caused by downstream thermal budget in Front-End-Of-the-Line (FEOL), Middle-Of-the-Line (MOL) and Back-End-Of-the-Line (BEOL). The epitaxial multi-layer stack of Gate-All-Around (GAA) devices, such as nanosheet (NS) may be grown on top of a sacrificial layer, such as a SiGe 45% layer, which is subsequently replaced with a bottom dielectric isolation (BDI) layer during device fabrication. The BDI layer suppress any potential parasitic leakage currents from the Source Epitaxy contact to the Drain Epitaxy contact via the substrate under the gate region However, if formed before the Source/Drain Epitaxy contacts, such BDI layer do not provide a bottom nucleation region from the substrate for epitaxial growth of the S/D regions. This limits the nucleation and growth of the S/D regions to the nanosheet channel edges and supports only lateral lattice growth. Growing S/D regions laterally from the channel edges is more challenging than growth from both the substrate surface and the channel edges. Nucleation and lateral growth from only the channel edges prevents the formation of channel lattice stain through the S/D region growth. Disclosed embodiments enable nucleation and growth of device S/D regions from both a sacrificial substrate layer and channel edges, enabling the induction of mechanical strains in the channels, while also providing bottom S/D isolation.

In an embodiment, following formation of NS device S/D regions and replacement metal gate (RMG) structures, a sacrificial semiconductor layer disposed below the formed device is removed and replaced with a dielectric material. In an embodiment, the layer is replaced with a stressor dielectric material to maintain or amplify the stress induced in the nanosheet channels during epitaxial growth of the S/D regions. The dielectric isolation material extends across the active region of the device as well as vertically along the edges of the device in gate diffusion break regions. The BDI material may further include an air gap to further improve the electrical isolation provided by the layer.

In an embodiment, a similar BDI is formed below finFET devices. A sacrificial layer below the devices provides a seed for nucleation and growth of device S/D regions between the layer and the device fins. Following device fabrication including RMG formation, the layer is replaced with a BDI layer. In an embodiment, the BDI layer includes stressor materials to maintain or amplify the channel stresses induced during growth of the S/D regions.

In an embodiment, following formation of nanosheet device S/D regions and replacement metal gate (RMG) structures, a sacrificial semiconductor layer disposed below the formed device is removed and replaced with a dielectric material. In an embodiment, the layer is replaced with a stressor dielectric material to maintain or amplify the stress induced in the nanosheet channels during epitaxial growth of the S/D regions. In this embodiment, formation of the FET elements includes over etching between the gate elements, into the bottom sacrificial layer. A thin seed layer is then epitaxially grown upon exposed semiconductor surfaces and the S/D regions are epitaxially grown from the seed layer, inducing strain in the device channels. In this embodiment, after removal of the sacrificial materials, the void space beneath the device active region is enlarged and the bottom semiconductor layers of the nanosheet stacks are thinned. In this embodiment, individual air pockets are formed beneath each device gate region. The dielectric isolation material extends across the active region of the device as well as vertically along the edges of the device in gate diffusion break regions. The BDI material may further include an air gap extending across the active region, to further improve the electrical isolation provided by the layer.

In an embodiment, a similar BDI is formed below finFET devices. A sacrificial layer below the devices provides a seed for nucleation and growth of device S/D regions between the layer and the device fins. Following device fabrication including RMG formation, the layer is replaced with a BDI layer. In an embodiment, the BDI layer includes stressor materials to maintain or amplify the channel stresses induced during growth of the S/D regions. In this embodiment, formation of the FET elements includes over etching between the gate elements, into the bottom sacrificial layer. A thin seed layer is then epitaxially grown upon exposed semiconductor surfaces and the S/D regions are epitaxially grown from the seed layer, inducing strain in the device channels. In this embodiment, after removal of the sacrificial materials, the void space beneath the device active region is enlarged and the bottom semiconductor layers of the nanosheet stacks are thinned. In this embodiment, individual air pockets are formed beneath each device gate region. The dielectric isolation material extends across the active region of the device as well as vertically along the edges of the device in gate diffusion break regions. The BDI material may further include an air gap extending across the active region, to further improve the electrical isolation provided by the layer.

Reference is now made to the figures. The figures provide schematic cross-sectional illustration of semiconductor devices at intermediate stages of fabrication, according to one or more embodiments of the invention. The figures provide schematic representations of the devices of the invention and are not to be considered accurate or limiting with regards to device element scale.

FIG. 1A provides a schematic plan view of a device 100, according to an embodiment of the invention. As shown in the Figure, gate structures 14, are disposed perpendicular to nanosheet stacks 12. Section lines X, Y1, and Y2, indicate the viewpoints of the respective views of FIGS. 1-11.

Figure 1B:
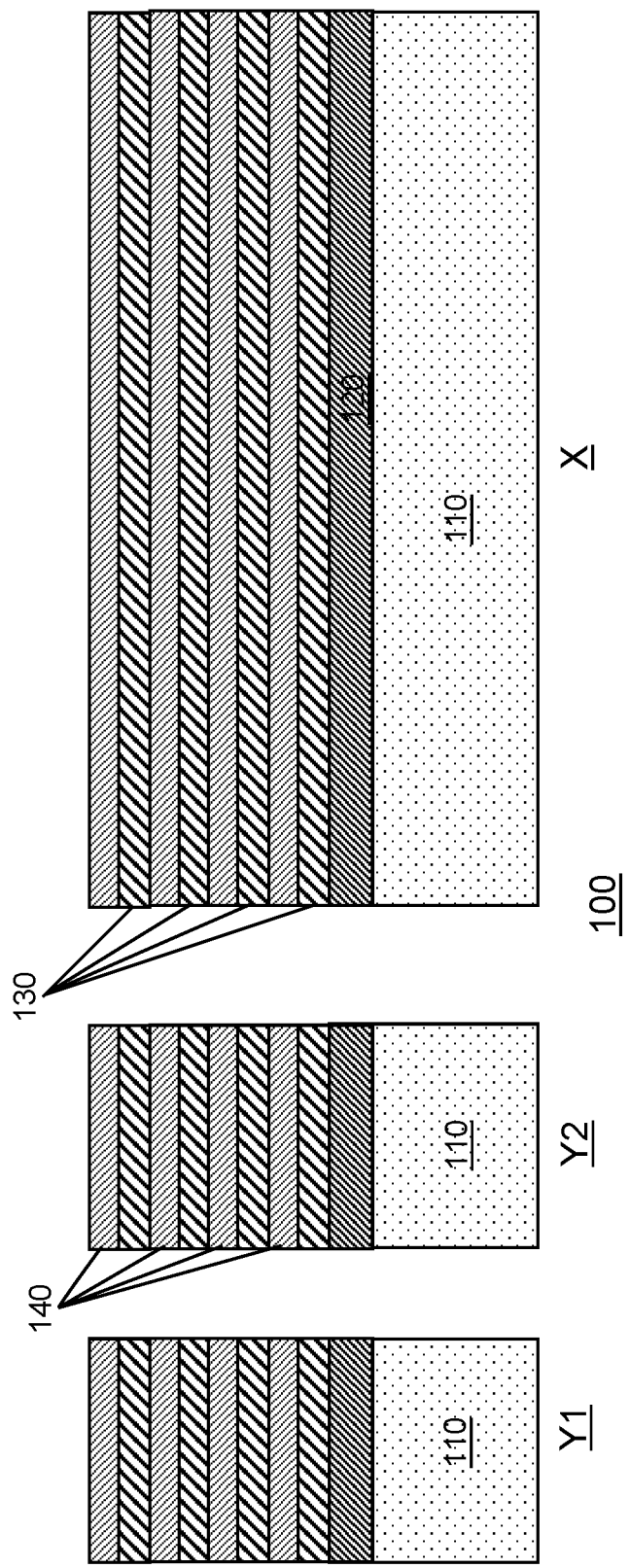
FIG. 1B provides a cross-sectional view of a step in the fabrication of a semiconductor device, according to an embodiment of the invention. The figure illustrates the formation of stacks of nanosheets of alternating materials.

FIG. 1B provides a schematic view of a device 100 according to an embodiment of the invention following the deposition of a stack of layers for the formation of FET device nanosheets. In an embodiment, the stack includes alternating layers of epitaxially grown silicon germanium 140, 120, and silicon 130. Other materials having similar properties may be used in place of the SiGe and Si.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

The nanosheet stack includes a bottom-most layer of a first semiconductor material, such as Si and alternating layers of a second semiconductor material, such as SiGe.

The nanosheet stack is depicted with nine layers (four SiGe layers and four Si layers forming a device, and a high Ge concertation, e.g., 40%-70% Ge, SiGe layer 120, separating the device stack from the underlying semiconductor substrate 110. However, any number and combination of layers can be used so long as the layers alternate between SiGe and Si to form a device and include a high Ge concentration SiGe layer separating the device from the substrate. The nanosheet stack is depicted with the layers being in the form of nanosheets, however the width of any given nanosheet layer can be varied so as to result in the form of a nanowire, a nanoellipse, a nanowire, etc. SiGe layers 140, 120, can be composed of, for instance, $SiGe_{15-35}$, examples thereof including, but not limited to $SiGe_{15}$, $SiGe_{20}$, $SiGe_{25}$ ... $SiGe_{35}$.

Substrate 110 can be composed of any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

In an embodiment, each sacrificial semiconductor material layer 140 and 120, is composed of a first semiconductor material which differs in composition from at least an upper portion of the semiconductor substrate 110. In one embodiment, the upper portion of the semiconductor substrate 110 is composed of silicon, while each sacrificial semiconductor material layers 140 and 120 is composed of a silicon germanium alloy. In such an embodiment, the SiGe alloy that provides each sacrificial semiconductor material layer 120 has a germanium content that is greater than 45 atomic percent germanium. In one example, the SiGe alloy that provides each sacrificial semiconductor material layer 120 has a germanium content from 45 atomic percent germanium to 70 atomic percent germanium. In such an embodiment, the SiGe alloy that provides each sacrificial semiconductor material layer 140 has a germanium content that is less than 45 atomic percent germanium. In one example, the SiGe alloy that provides each sacrificial semiconductor material layer 140 has a germanium content from 15 atomic percent germanium to 35 atomic percent germanium. The first semiconductor material that provides each sacrificial semiconductor material layers 140 and 120 can be formed utilizing an epitaxial growth (or deposition process).

Each semiconductor channel material layer 130, is composed of a second semiconductor material that has a different etch rate than the first semiconductor material of the sacrificial semiconductor material layers 140 and 120 and is also resistant to Ge condensation. The second semiconductor material of each semiconductor channel material layer 130, may be the same as, or different from, the semiconductor material of at least the upper portion of the semiconductor substrate 110. The second semiconductor material can be a SiGe alloy provided that the SiGe alloy has a germanium content that is less than 45 atomic percent germanium, and that the first semiconductor material is different from the second semiconductor material.

In one example, at least the upper portion of the semiconductor substrate 110 and each semiconductor channel material layer 130 is composed of Si or a III-V compound semiconductor, while each sacrificial semiconductor material layer 140, 120 is composed of a silicon germanium alloy. The second semiconductor material of each semiconductor channel material layer 130, can be formed utilizing an epitaxial growth (or deposition process).

Figure 2:
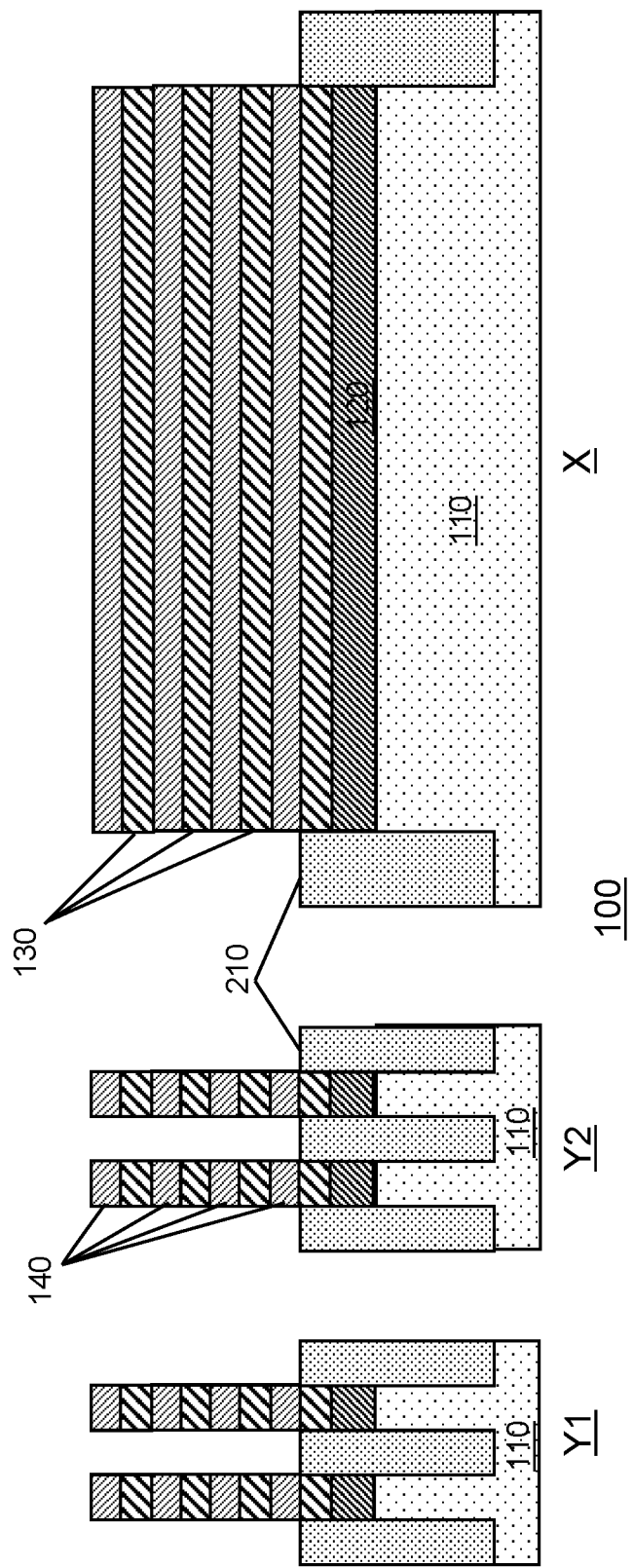
FIG. 2 provides a cross-sectional view of a step in the fabrication of a semiconductor device, according to an embodiment of the invention. The figure illustrates the device after the masking and selective recessing of the nanosheet stacks.

FIG. 2 illustrates device 100 following the patterning, masking and selective etching of the stack of nanosheet layers to form individual nanosheet fin stacks. In an embodiment, the stack includes alternating layers of epitaxially grown silicon germanium 140, 120, and silicon 130. Other materials having similar properties may be used in place of the SiGe and Si. In an embodiment, reactive ion etching recesses exposed nanosheet stack portions yielding the desired nanosheet stack fins.

In an embodiment, the etching proceeds into substrate 110. Deposition of a shallow trench isolation material 210, such as silicon dioxide, or any suitable combination of multiple dielectric materials (e.g., silicon nitride and silicon oxide), occurs after the formation of shallow trench isolation (STI) regions 210 between nanosheet stack circuit elements of the device. Following such deposition, chemical mechanical planarization (CMP) processes smooth the upper surface of the deposited oxide in preparation for the subsequent fabrication steps. An oxide recess process trims the upper surface of STI regions 210 to the level of the bottom semiconductor layer 130, and. STI regions 210 provide electrical isolation between adjacent NS transistors.

Figure 3:
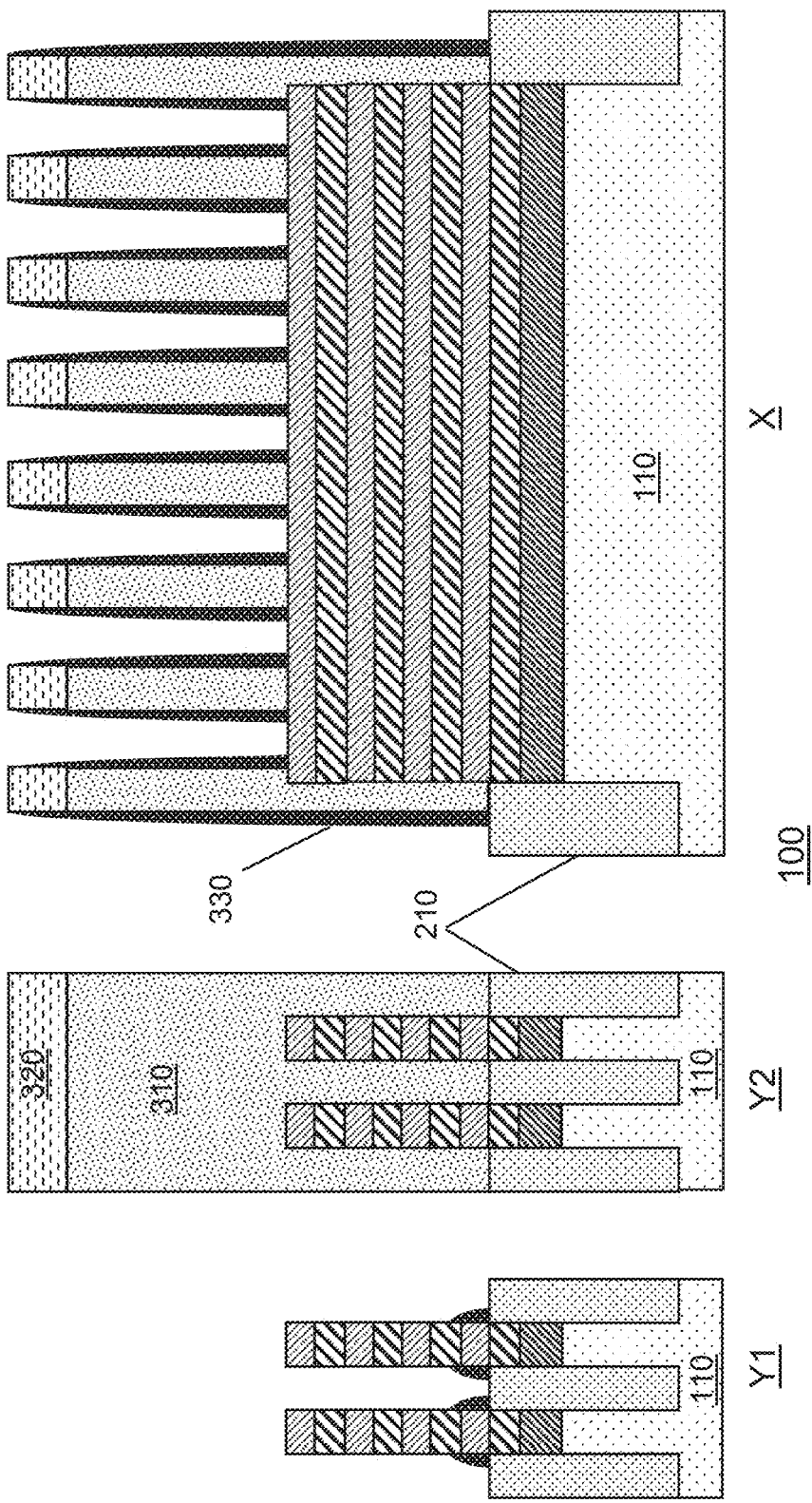
FIG. 3 provides a cross-sectional view of a step in the fabrication of a semiconductor device, according to an embodiment of the invention. The figure illustrates dummy gate structures formed above the stack of nanosheet layers.

FIG. 3 illustrates device 100 following the forming of at least one dummy gate structure on the nanosheet stack. Eight dummy gates are shown however any number of gates can be formed. Dummy gate structures can be formed by depositing a dummy gate material 220 over the nanosheet stack. "Depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. The dummy gate material can be, for example, a thin layer of oxide, followed by polycrystalline silicon, amorphous silicon or microcrystal silicon. After that, a hardmask layer 320 is deposited over the dummy gate, followed by lithographic patterning and masking and selective etching processes.

Hard mask 320 includes a nitride, oxide, an oxide-nitride bilayer, or another suitable material. In some embodiments, the hardmask 320 may include an oxide such as silicon oxide (SiO), a nitride such as silicon nitride (SiN), an oxynitride such as silicon oxynitride (SiON), combinations thereof, etc. In some embodiments, the hardmask 320 is a silicon nitride such as $Si_3N_4$.

FIG. 3 further illustrates device 100 following the deposition and subsequent etching, such as anisotropic etching to remove material from horizontal surfaces, of gate sidewall spacers 330 adjacent to the vertical surfaces of dummy gate materials 310 and hardmask 320. In an embodiment, gate sidewall material 330, may be the same material as hardmask 320, or may be different materials and may be comprised of any one or more of a variety of different insulative materials, such as Si$_3$N$_4$, SiBCN, SiNC, SiN, SiCO, SiO$_2$, SiNOC, etc. In this embodiment, after conformal deposition, selective etching, such as anisotropic reactive ion etching, removes gate sidewall spacer material 330 from horizontal surfaces of the intermediate stage of the device 100.

Figure 4:
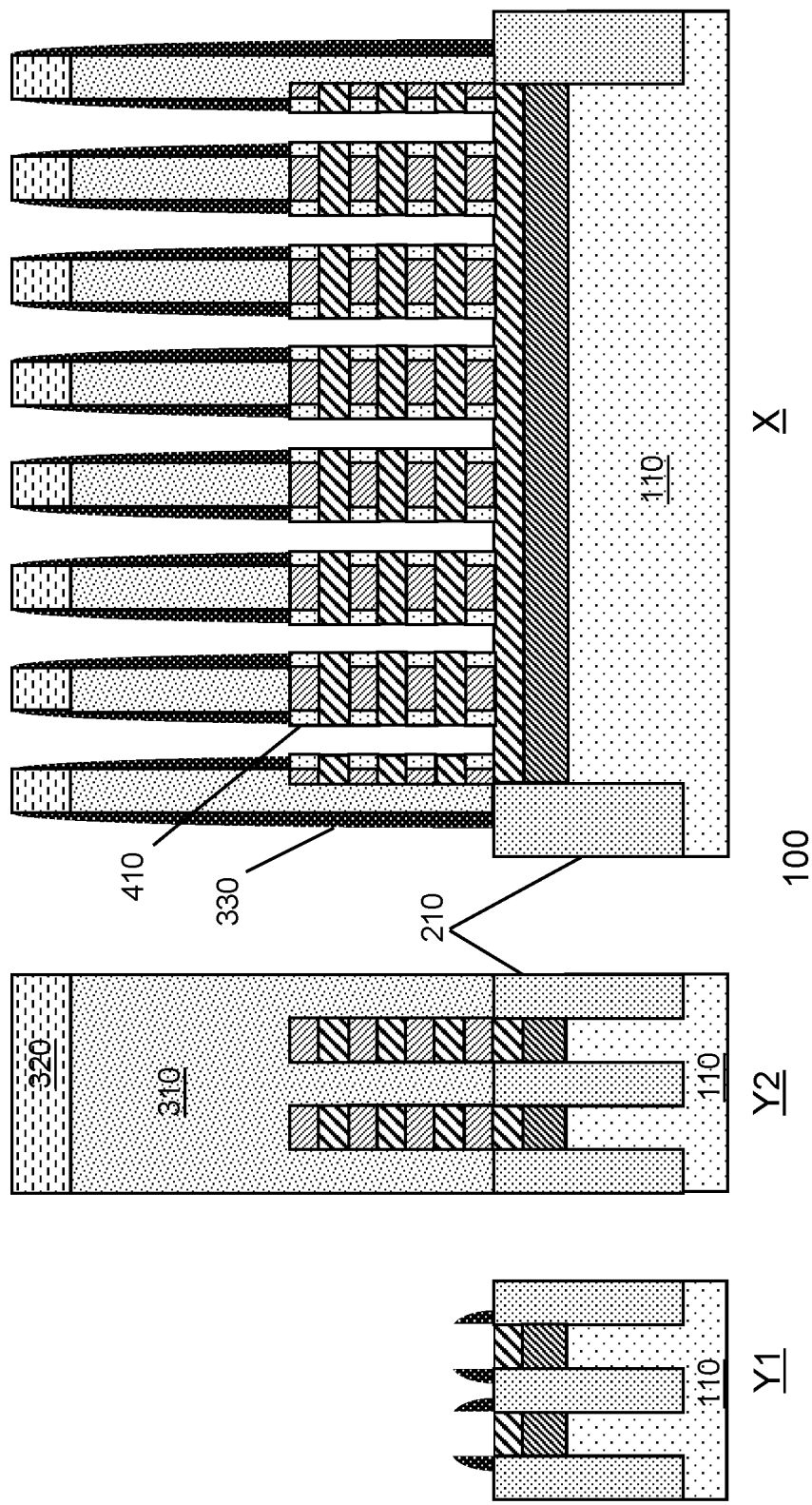
FIG. 4 provides a cross-sectional view, of a step in the fabrication of a semiconductor device, according to an embodiment of the invention. The figure illustrates the device after the formation of device active areas.

FIG. 4 illustrates device 100 following the selective masking and etching of nanosheets between dummy gate structures, and the formation of inner spacers between adjacent nanosheet channel layers 130, yielding individual gate structures. Selective anisotropic etching such as RIE removes portions of the alternating sacrificial layers 140 and channel layers 130 from between adjacent dummy gate structures. Protective gate sidewall spacers 330 prevent damage to the dummy gate structures. The nanosheet layer portions are removed to the upper surface of the lowest semiconductor layer 130.

FIG. 4 further illustrates device 100 following formation of inner spacers between nanosheets of the respective FET devices. Portions of nanosheet stack layers 130, and 140, which are not underneath gate sidewall spacers 330 and not underneath dummy gate 310 are removed. Etching generally refers to the removal of material from a substrate (or structures formed on the substrate) and is often performed with a mask in place so that material may selectively be removed from certain areas of the substrate, while leaving the material unaffected, in other areas of the substrate.

There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching.

After generally etching the nanosheet stack, a selective etching of SiGe layers 140 of the nanosheet stack removes portions of the layers which are underneath gate sidewall spacers 320. Inner spacers 410 are then formed in etched portions and thus are located under gate sidewall spacers 330. Inner spacers 410 can be composed of any suitable dielectric material, for example Si$_3$N$_4$, SiBCN, SiNC, SiN, SiCO, SiO$_2$, SiNOC, etc. The inner spacer 410 is formed by a conformal dielectric liner deposition followed by isotropic etching back, so dielectric liner is removed everywhere except the regions pinched-off in those under spacer cavities.

Figure 5:
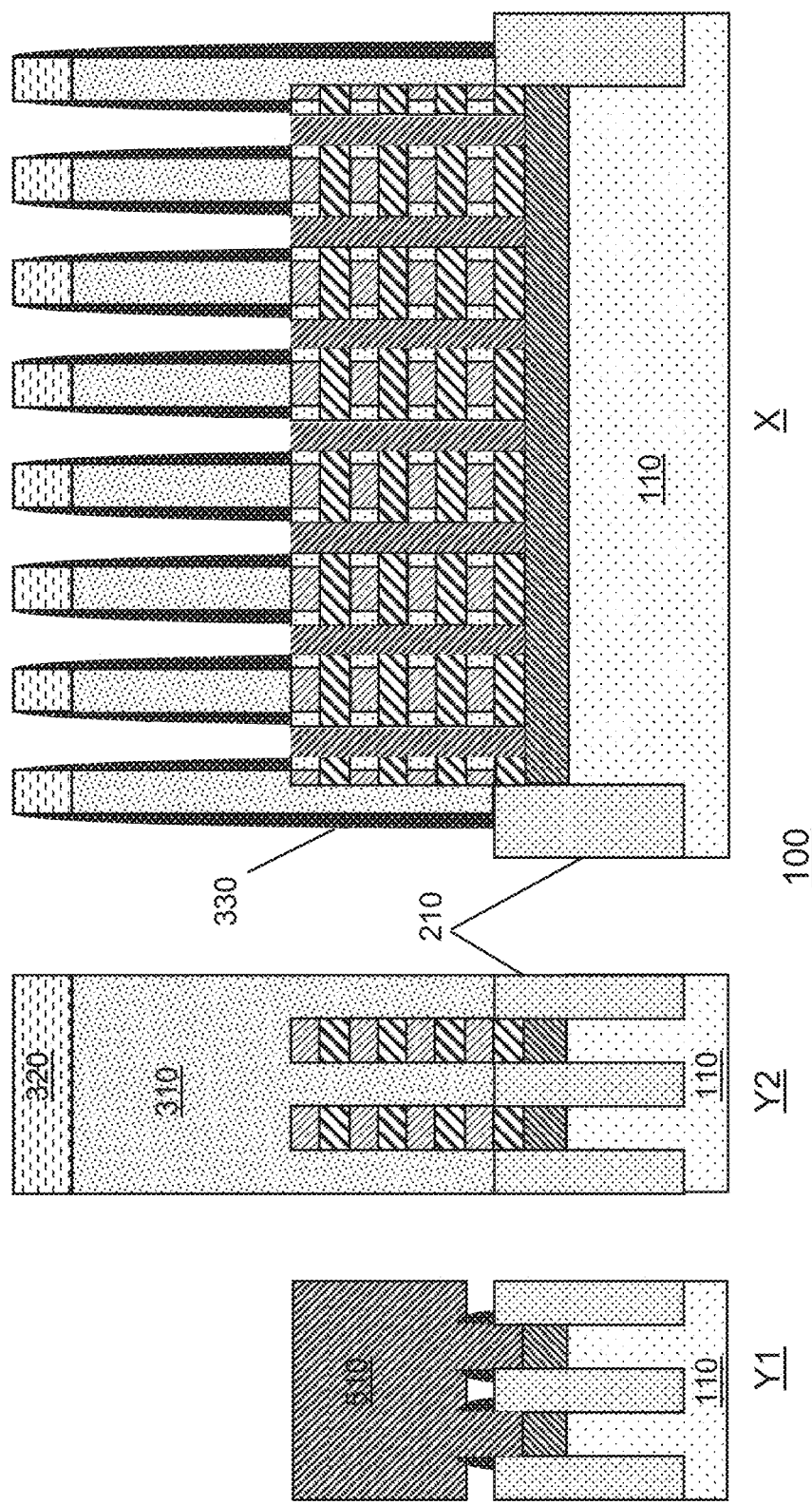
FIG. 5 provides a cross-sectional view of a step in the fabrication of a semiconductor device, according to an embodiment of the invention. The figure illustrates the device after the epitaxial growth of device source-drain regions.

FIG. 5 illustrates device 100 following etching removal of the bottom semiconductor layer 130 from the etched channels between dummy gate structures. Semiconductor layer 130 is removed, exposing sacrificial layer 120 of device 100 in these etched channels between gate structures.

FIG. 5 further illustrates device 100 following the epitaxial growth of device source-drain regions starting from sacrificial semiconductor layer 120 as well as the edges of nanosheet channel layers 130. Material differences between sacrificial layer 120, source-drain material 510, and nanosheet channels 130 yield differing crystalline lattice structures. Such lattice differences are accommodated by mechanical strains induced in the grown lattices of the source-drain regions 510 as well as lattice strains in sacrificial layer 120 and nanosheet channels 130. Such lattice strains enhance charge mobility across device elements such as channel nanosheets 130, during operation of the FET devices.

In the present embodiments, the source-drain regions 510 may be doped in situ by adding one or more dopant species to the epitaxial material. The dopant used will depend on the type of FET being formed, whether p-type or n-type. As used herein, "p-type" refers to the addition of impurities to an intrinsic semiconductor that creates deficiencies of valence electrons. In a silicon-containing semiconductor, examples of p-type dopants, i.e., impurities, include but are not limited to boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous.

Figure 6:
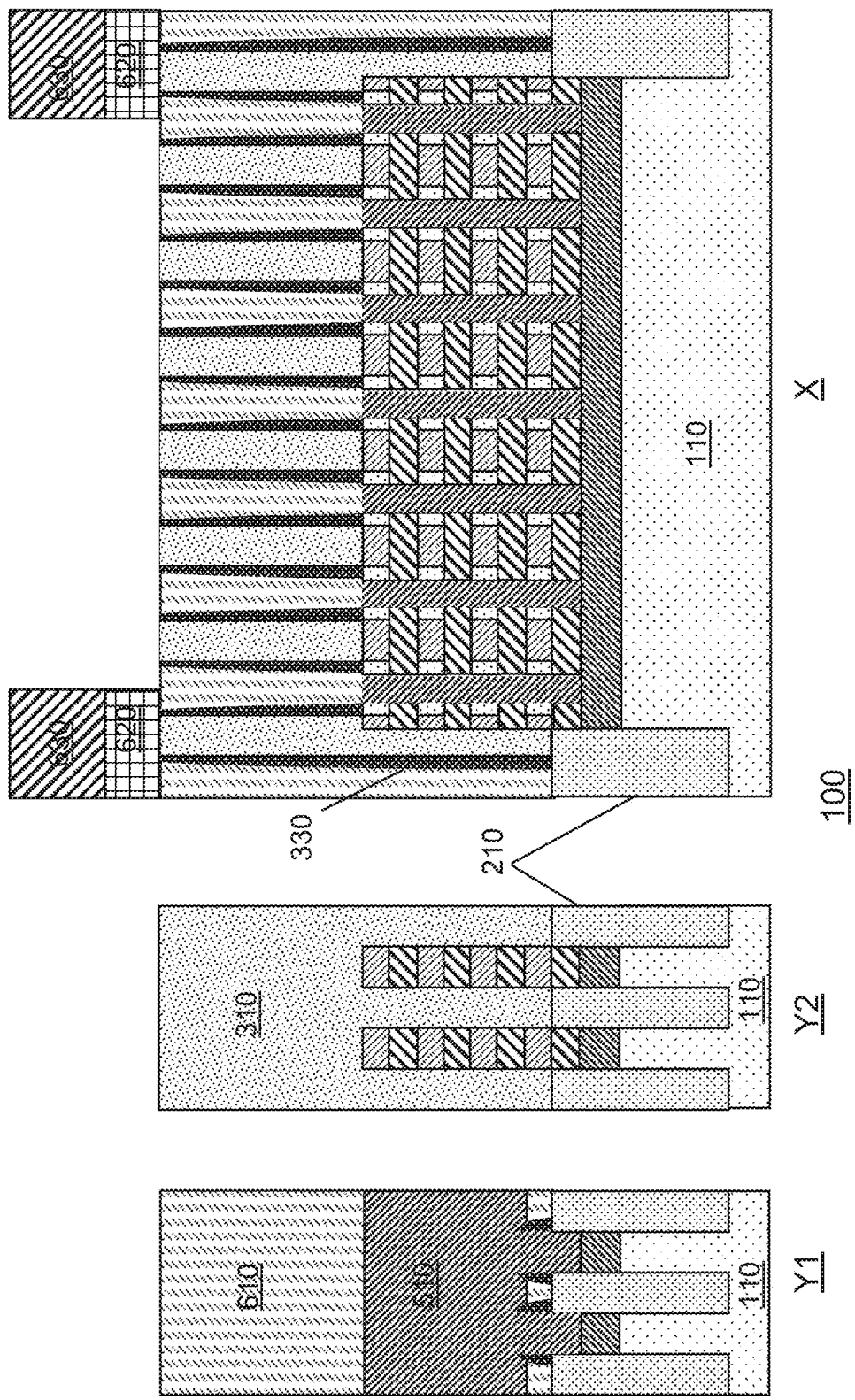
FIG. 6 provides a cross-sectional view of a step in the fabrication of a semiconductor device, according to an embodiment of the invention. The figure illustrates the device after the encapsulation of device active regions with an interlayer dielectric and the formation of protective hardmasks for tuck-under gate structures.

FIG. 6 illustrates device 100 following removal of dummy gate hard masks 320, and encapsulation of the dummy gates and S/D regions with an interlayer dielectric material 610, such as flowable silicon oxide, encapsulates the NS stack, S/D regions 510, including under S/D regions 510, and dummy gates and gate sidewall spacers 330. FIG. 6 further illustrates device 100 following formation of protective hardmasks 620, above edge tuck-under gates, as well as showing organic planarization material 630 above the protective hardmasks 620. A material such as SiN may be used for protective hardmasks 620. OPL material 630 enables the patterning of hardmask 620 for selective etching to expose the upper surfaces of dummy gates 310.

Figure 7:
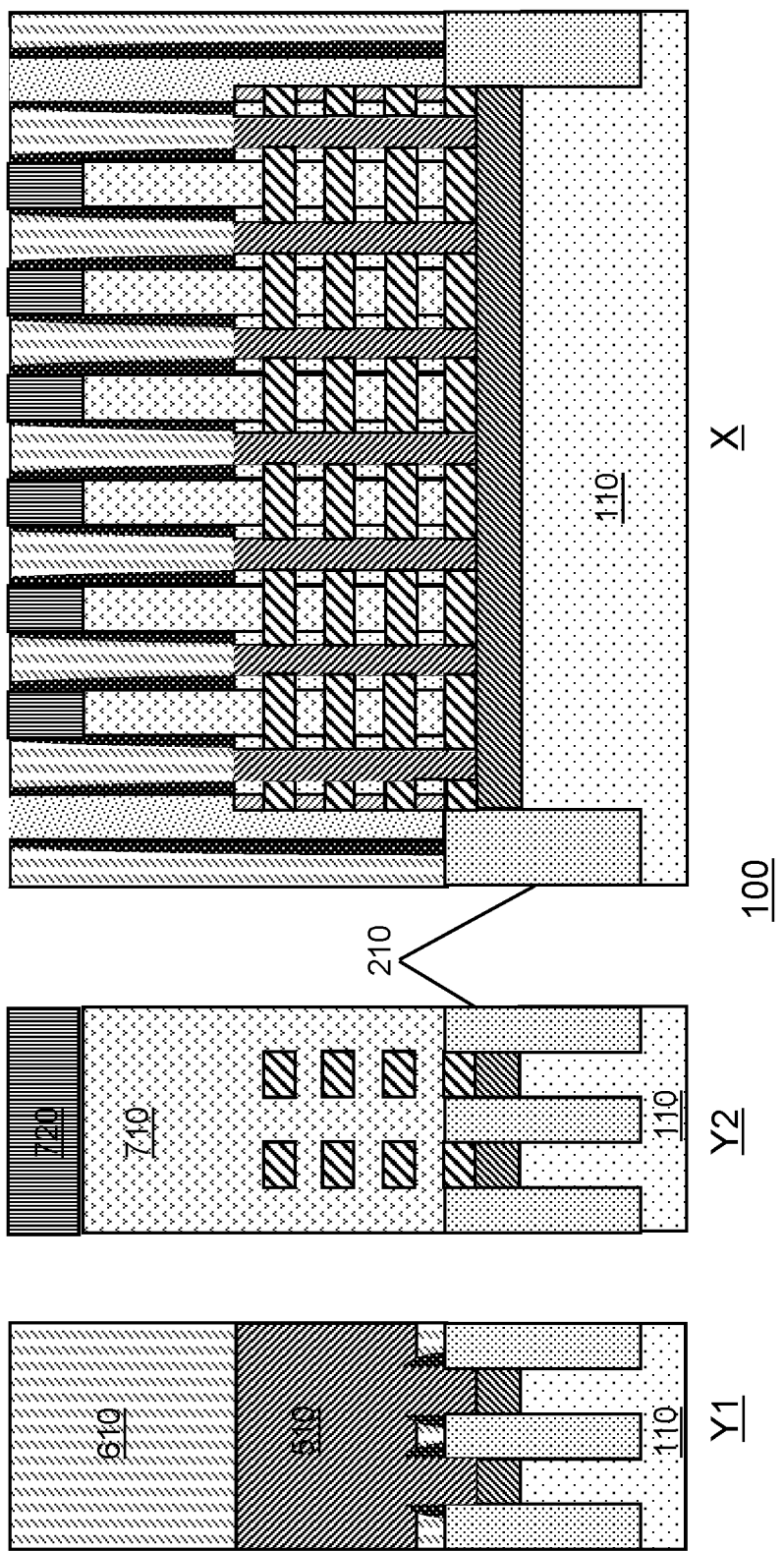
FIG. 7 provides a cross-sectional view of a step in the fabrication of a semiconductor device, according to an embodiment of the invention. The figure illustrates the device after the formation of replacement metal gate structures.

FIG. 7 illustrates device 100 following the removal of dummy gate 310, sacrificial SiGe 140, and formation of the high-k metal gate (HKMG) stack 710, and a protective gate cap dielectric 720. As shown in the Figure, a replacement metal gate structure has been formed in the void space created by removal of the dummy gate 310, and sacrificial SiGe 140. Gate structure 710 includes gate dielectric and gate metal layers (not shown). The gate dielectric is generally a thin film and can be silicon oxide, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as lanthanum, aluminum, magnesium. Gate dielectric can be deposited by CVD, ALD, or any other suitable technique. Metal gate can include any known metal gate material known to one skilled in the art, e.g., TiN, TiAl, TiC, TiAlC, tantalum (Ta) and tantalum nitride (TaN), W, Ru, Co, Al. Metal gates may be formed via known deposition techniques, such as atomic layer deposition, chemical vapor deposition, or physical vapor deposition. It should be appreciated that a chemical mechanical planarization (CMP) process can be applied to the top surface. In an embodiment, the replacement metal gate includes work-function metal (WFM) layers, (e.g., titanium nitride, titanium aluminum nitride, titanium aluminum carbide, titanium aluminum carbon nitride, and tantalum nitride) and other appropriate metals and conducting metal layers (e.g., tungsten, cobalt, tantalum, aluminum, ruthenium, copper, metal carbides, and metal nitrides). After formation and CMP of the HKMG, the HKMG can be optionally recessed followed by a deposition and CMP of a gate cap dielectric material 720, such as SiN, or similar materials, completing the replacement metal gate fabrication stage for the device. The CMP process may further remove protective hardmask 620 from the upper surface of the device.

Figure 8:
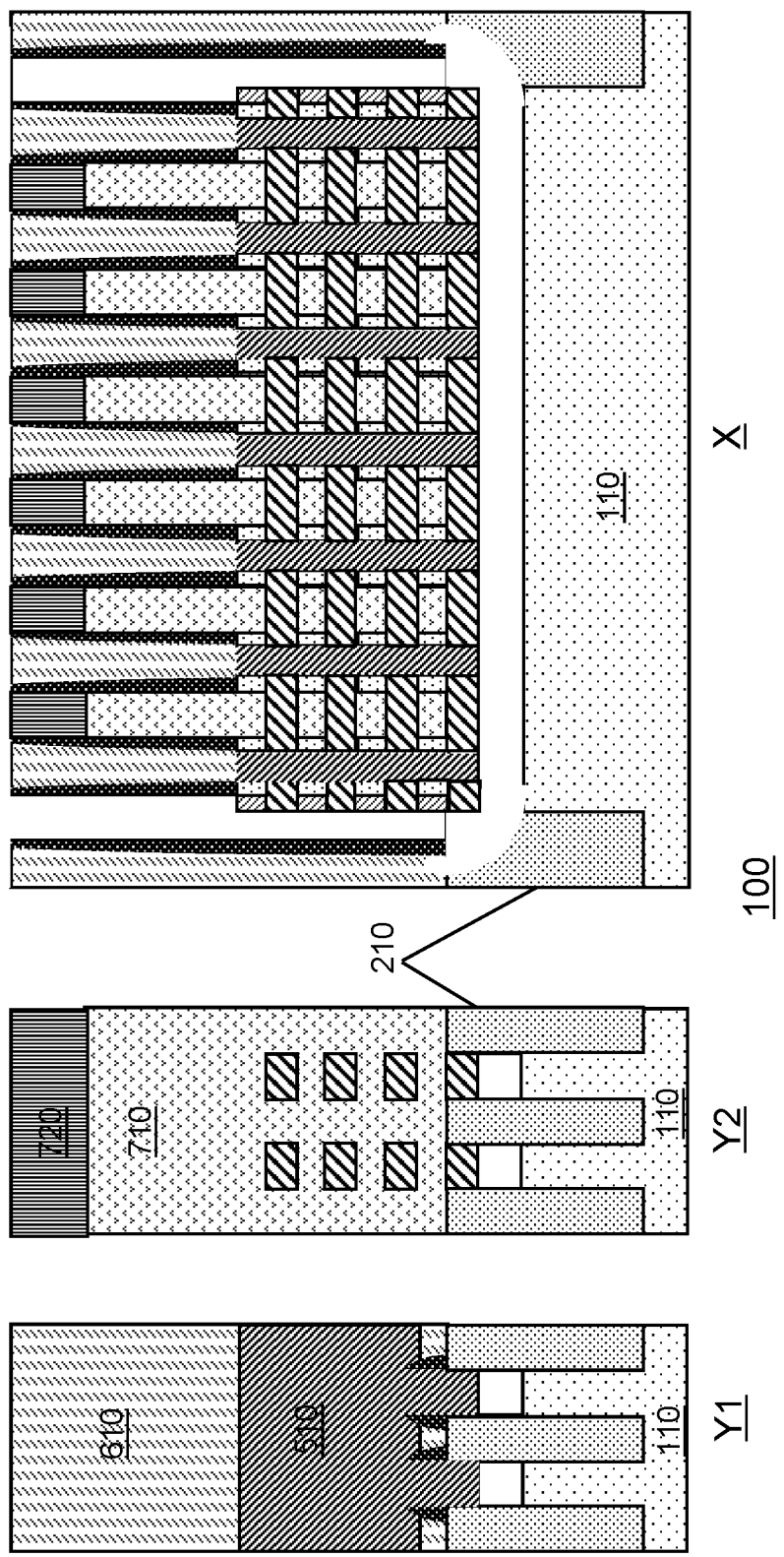
FIG. 8 provides a cross-sectional view of a step in the fabrication of a semiconductor device, according to an embodiment of the invention. The figure illustrates the device after the removal of dummy tuck-under gates, the recessing of shallow trench isolation regions and the removal of a sacrificial semiconductor layer.

FIG. 8 illustrates device 100 following release and selective removal of edge dummy gates 310, portions of STI 210, and sacrificial layer 120 from beside and beneath the formed HKMG structures. The appearance of FIG. 8 is that the HKMG device are suspended in air above the substrate. The HKMG devices are supported by device portions out of the plane of the views of the figures. Selective etching removes the dummy gate materials as well as the high Ge concentration sacrificial layer without disturbing the nanosheet channels 130, or sacrificial layers 140 of the structure.

Figure 9:
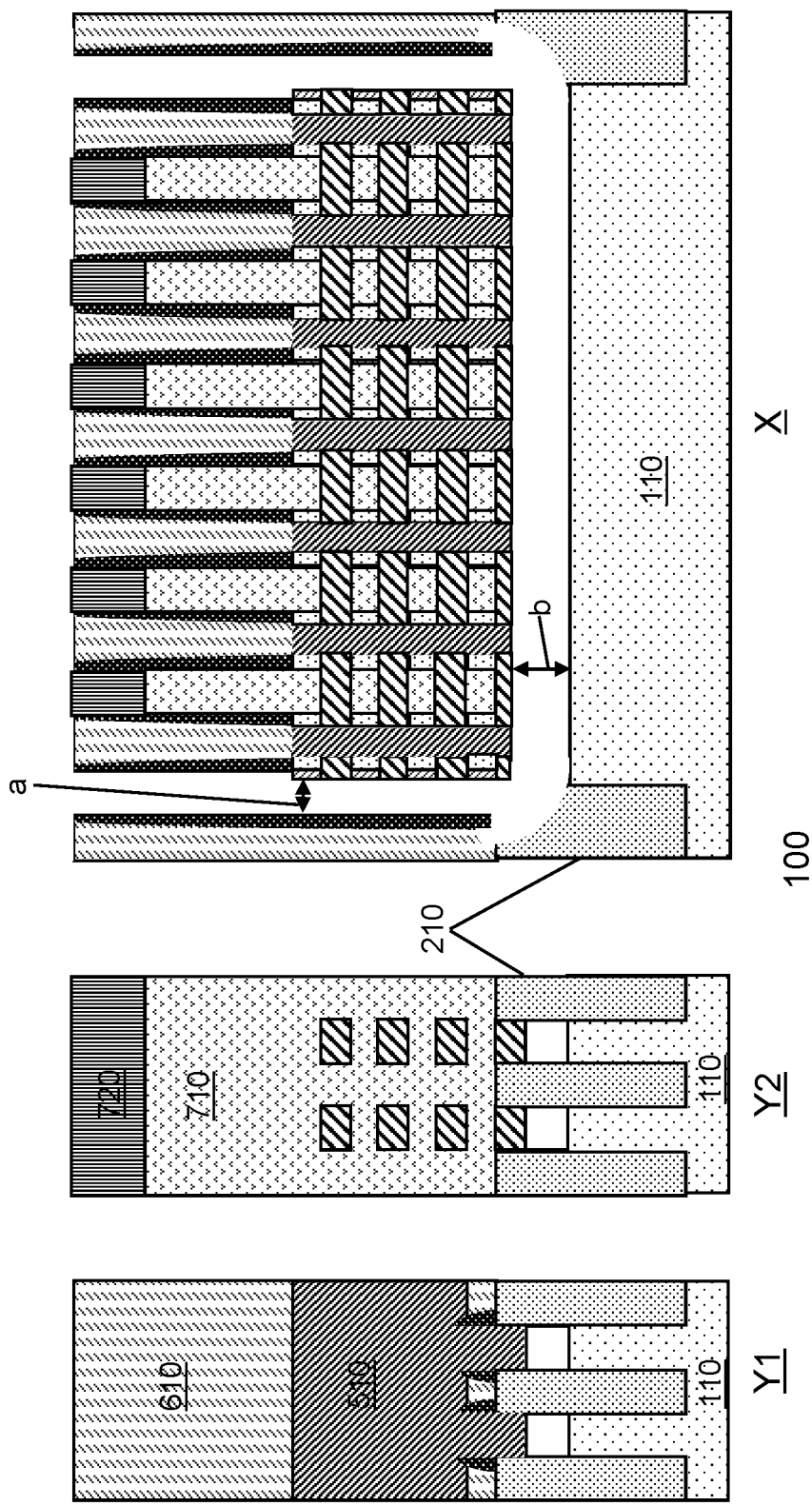
FIG. 9 provides a cross-sectional view of a step in the fabrication of a semiconductor device, according to an embodiment of the invention. The figure illustrates the device after the expansion of the bottom void by thinning the bottom device channels.

FIG. 9 illustrates device 100 following an optional expansion of the void space left after removal of dummy gate materials, STI, and sacrificial layer 120 from the structure. Such an enlargement of the space provides increased volume for bottom dielectric isolation materials to better isolate S/D regions across the device. Expanding the space thins the bottom semiconductor layer 130 beneath the HKMG stacks, reducing the possibility of parasitic S/D leakage current through this layer. As shown in the Figure, exposed portions of nanosheet channels 130 and sacrificial layers 140, are also removed enlarging the vertical tuck-under gate regions on the left and right edges of the device structure. FIG. 9 further illustrates cross-section dimensions a, and b, of the void space.

Figure 10:
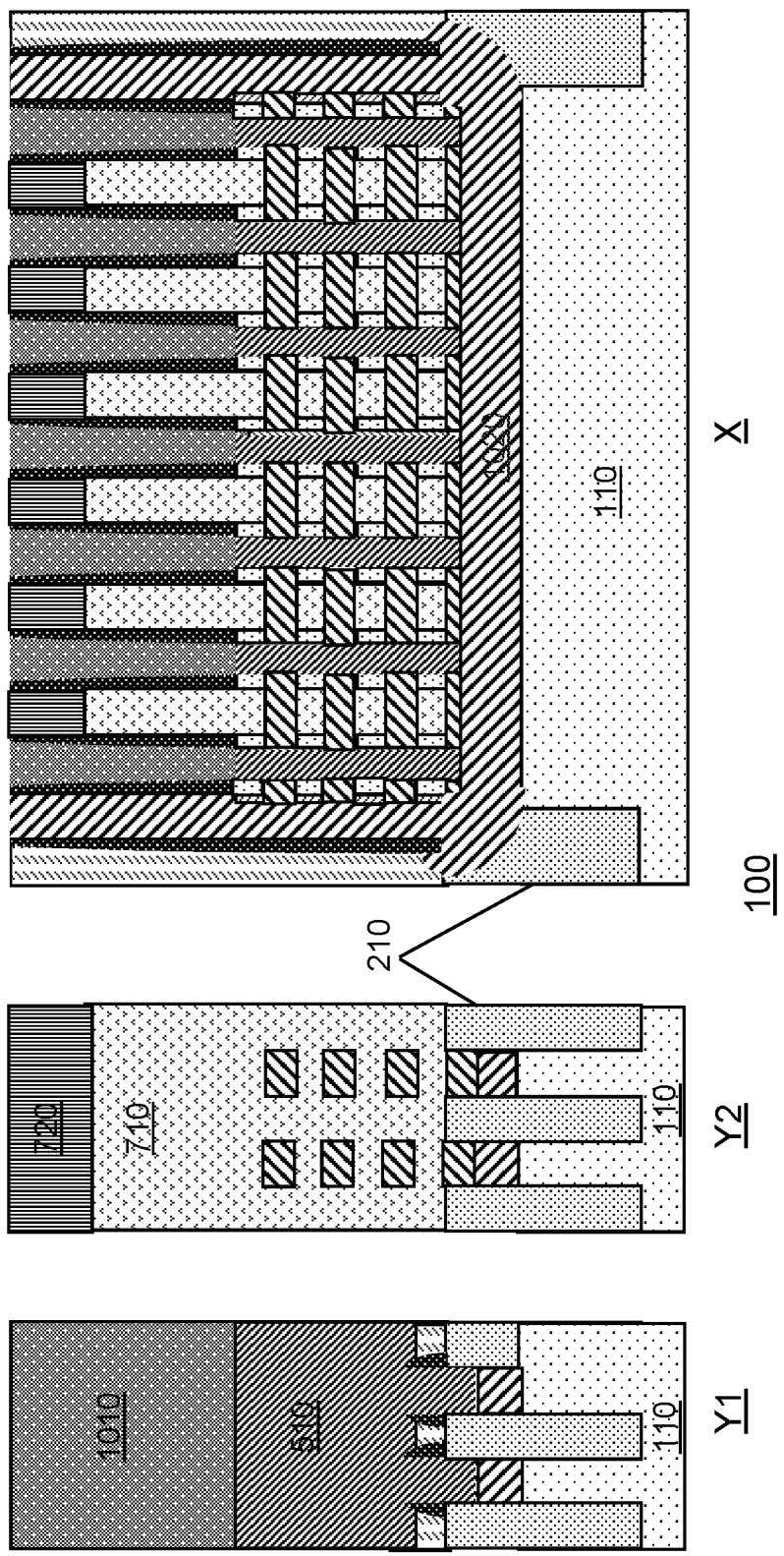
FIG. 10 provides a cross-sectional view of a step in the fabrication of a semiconductor device, according to an embodiment of the invention. The figure illustrates the device after the deposition of a bottom dielectric isolation material in the bottom and side voids.

FIG. 10 illustrates device 100 following deposition of BDI material 1020 as well as the formation of trench metal contacts 1010 above the S/D regions 510 of the FET devices. A trench metal contact process yields a metallized layer adjacent to and above the S-D region 510, and gate sidewall spacers 330. In an embodiment, formation of the trench metal layer 1010 includes forming a silicide layer between contact and epitaxial grown S/D regions 510 (e.g., Ni silicide, Ti silicide, NiPt silicide, Co silicide, etc.) followed by forming metallization materials above the silicide (e.g., a thin adhesion metal such as TiN and a bulk metal fill such as Co, W, etc., followed by CMP.

In an embodiment, conformal deposition of a low-k material such as SiOC, SiOCN, SiBCN, SiO2, etc., may be deposited in the formed void space to provide electrical isolation to the FET S/D and gate regions. In an embodiment, a dielectric stressor material such as a silicon nitride is deposited using PEALD or PECVD to fill the void space. Formation of the BDI from the stressor dielectric applies stress to the S/D regions and through those regions to the nanosheet channels 130, of the device. It is worth noting that the dominant component of the tensile or compressive S/D stress can arise from the diffusion break regions of the structure.

Figure 11:
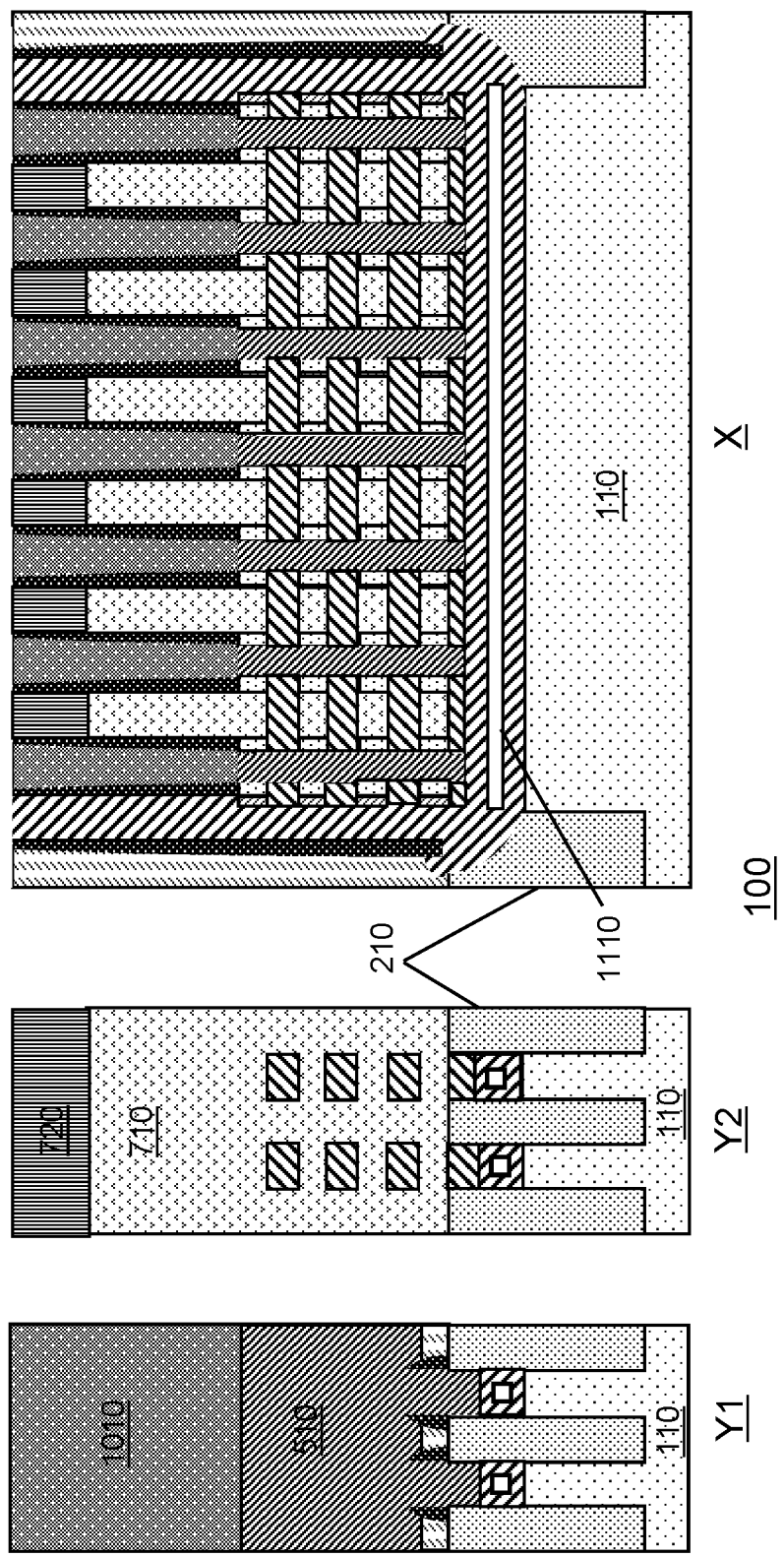
FIG. 11 provides a cross-sectional view of a step in the fabrication of a semiconductor device, according to an embodiment of the invention. The figure illustrates the device after the deposition of a bottom dielectric isolation material.

FIG. 10 illustrates an embodiment wherein dimensions a and b are similar in magnitude, or wherein a exceeds b, such that the horizontal portions of the void space completely fills with BDI material 1020. FIG. 11 illustrates an embodiment wherein dimension a is less than b. In this embodiment, the vertical gates fill before the entire horizontal void space fills, resulting in the formation of the BDI including air gap 1110.

FIGS. 12A-21 illustrate a second embodiment of the device wherein the FET elements comprise finFETs rather than horizontal NS FET elements.

Figure 12A:
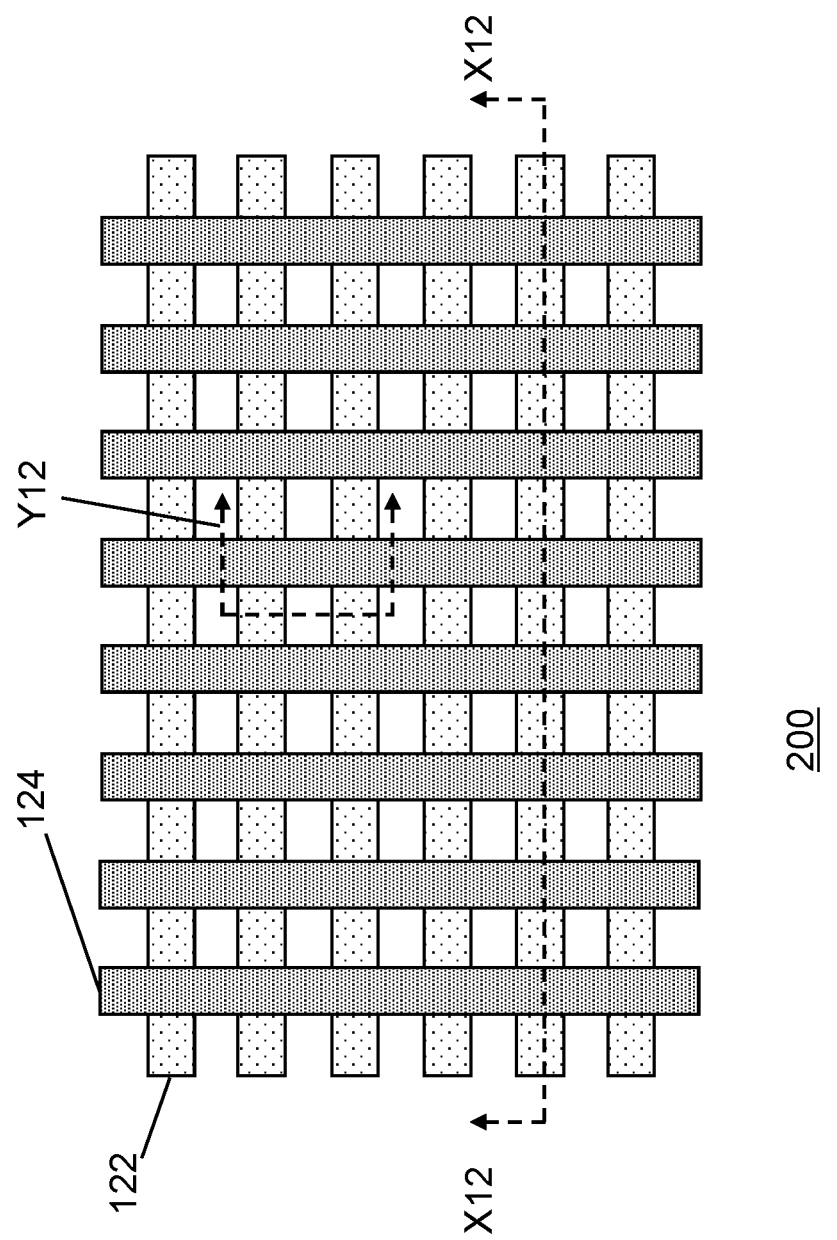
FIG. 12A provides a plan view of a semiconductor device, according to an embodiment of the invention. The figure illustrates the section lines used for the respective views of FIGS. 12-21.

FIG. 12A provides a schematic plan view of a device 200, according to an embodiment of the invention. As shown in the Figure, gate structures 124, are disposed perpendicular to finFET stacks 122. Section lines X12, and Y12, indicate the viewpoints of the respective views of FIGS. 12-21.

Figure 12B:
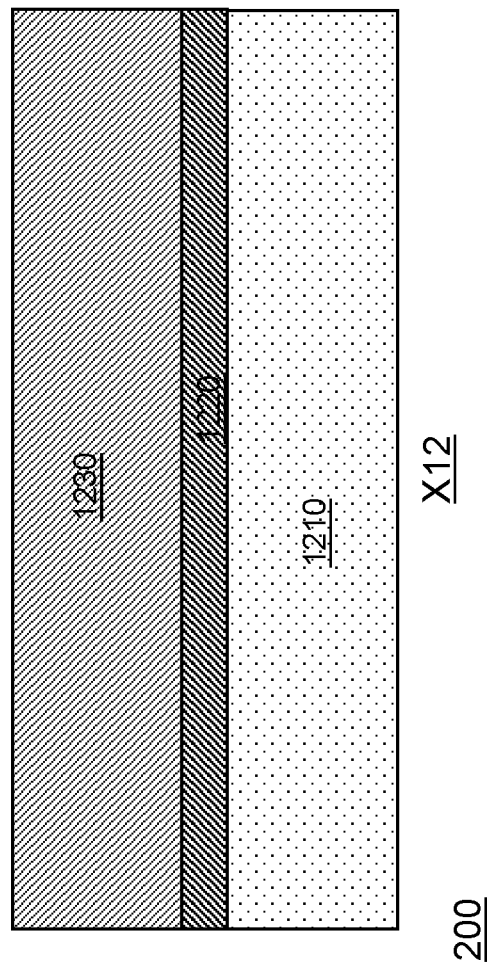
FIG. 12B provides a cross-sectional view of a step in the fabrication of a semiconductor device, according to an embodiment of the invention. The figure illustrates the formation of stacks of layers of alternating materials.
Figure 12B:
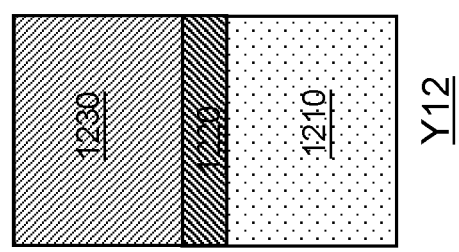

FIG. 12B provides a schematic view of a device 200 according to an embodiment of the invention following the deposition of a stack of layers for the formation of FET devices. In an embodiment, the stack includes layers of silicon germanium 1220, and silicon 1230, epitaxially grown upon underlying semiconductor substrate 1210. Other materials having similar properties may be used in place of the SiGe and Si.

SiGe layer 1220, separates the Si layer 1230 from the underlying semiconductor substrate 1210. SiGe layer 1220, can be composed of, for instance, $SiGe_{15\text{-}35}$, examples thereof including, but not limited to $SiGe_{15}$, $SiGe_{20}$, $SiGe_{25}$ ... $SiGe_{35}$.

Substrate 1210 can be composed of any currently known or later developed semiconductor material, such as those described above. In an embodiment, sacrificial semiconductor material layer 1220, is composed of a first semiconductor material which differs in composition from at least an upper portion of the semiconductor substrate 1210. In one embodiment, the upper portion of the semiconductor substrate 1210 is composed of silicon, while sacrificial semiconductor material layer 1220 is composed of a silicon germanium alloy. In such an embodiment, the SiGe alloy that comprises sacrificial semiconductor material layer 1220 has a germanium content that is less than 50 atomic percent germanium. In one example, the SiGe alloy that comprises sacrificial semiconductor material layer 1220 has a germanium content from 15 atomic percent germanium to 35 atomic percent germanium. The first semiconductor material that provides sacrificial semiconductor material layer 1220 can be formed utilizing an epitaxial growth (or deposition process).

Semiconductor channel material layer 1230, is composed of a second semiconductor material that has a different etch rate than the first semiconductor material of the sacrificial semiconductor material layer 1220 and is also resistant to Ge condensation. The second semiconductor material of each semiconductor channel material layer 1230, may be the same as, or different from, the semiconductor material of at least the upper portion of the semiconductor substrate 1210.

In one example, at least the upper portion of the semiconductor substrate 1210 and each semiconductor channel material layer 1230 is composed of Si or a III-V compound semiconductor, while sacrificial semiconductor material layer 1220 is composed of a silicon germanium alloy. The second semiconductor material of each semiconductor channel material layer 1230, can be formed utilizing an epitaxial growth (or deposition process).

Figure 13:
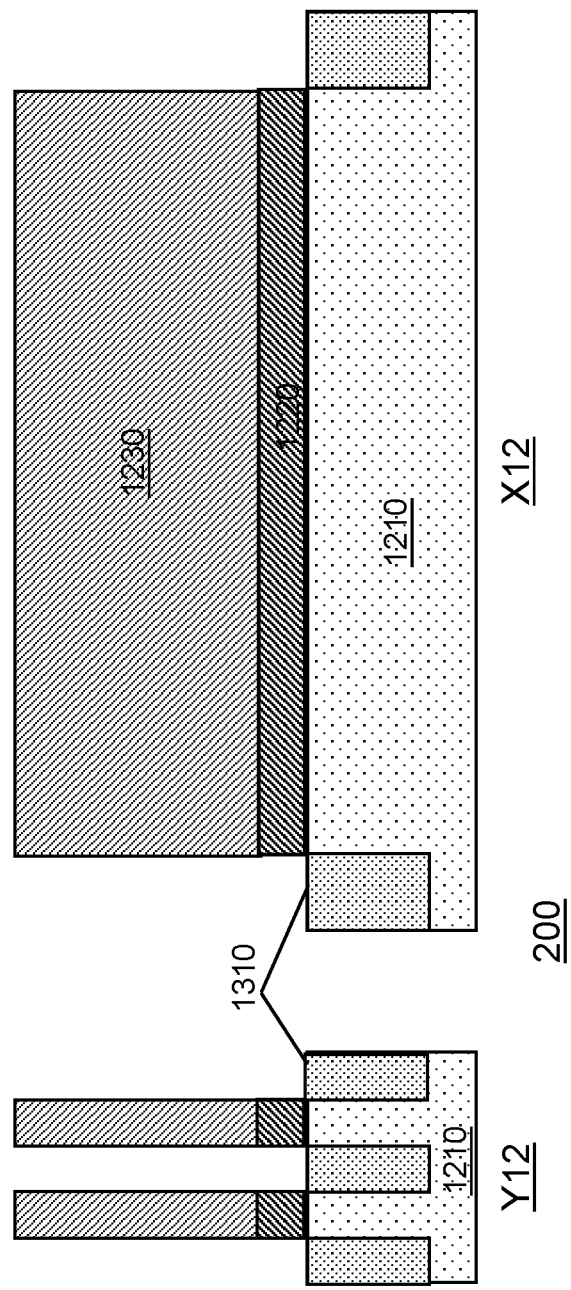
FIG. 13 provides a cross-sectional view of a step in the fabrication of a semiconductor device, according to an embodiment of the invention. The figure illustrates the device after the masking and selective recessing of the layered stacks.

FIG. 13 illustrates device 200 following the patterning, masking and selective etching of the stack of layers to form individual fin stacks. In an embodiment, the stack includes layers of epitaxially grown silicon germanium 1220, and silicon 1230. Other materials having similar properties may be used in place of the SiGe and Si. In an embodiment, reactive ion etching recesses exposed nanosheet stack portions yielding the desired stack fins.

In an embodiment, the etching proceeds into substrate 1210. Deposition of a shallow trench isolation material 1310, such as silicon dioxide, or any suitable combination of multiple dielectric materials (e.g., silicon nitride and silicon oxide), occurs after the formation of shallow trench isolation (STI) regions 1310 between finFET stack circuit elements of the device. Following such deposition, chemical mechanical planarization (CMP) processes smooth the upper surface of the deposited oxide in preparation for the subsequent fabrication steps. An oxide recess process trims the upper surface of STI regions 1310 to the level of the substrate 1210, STI regions 1310 provide electrical isolation between source/drain regions of adjacent finFET transistors.

Figure 14:
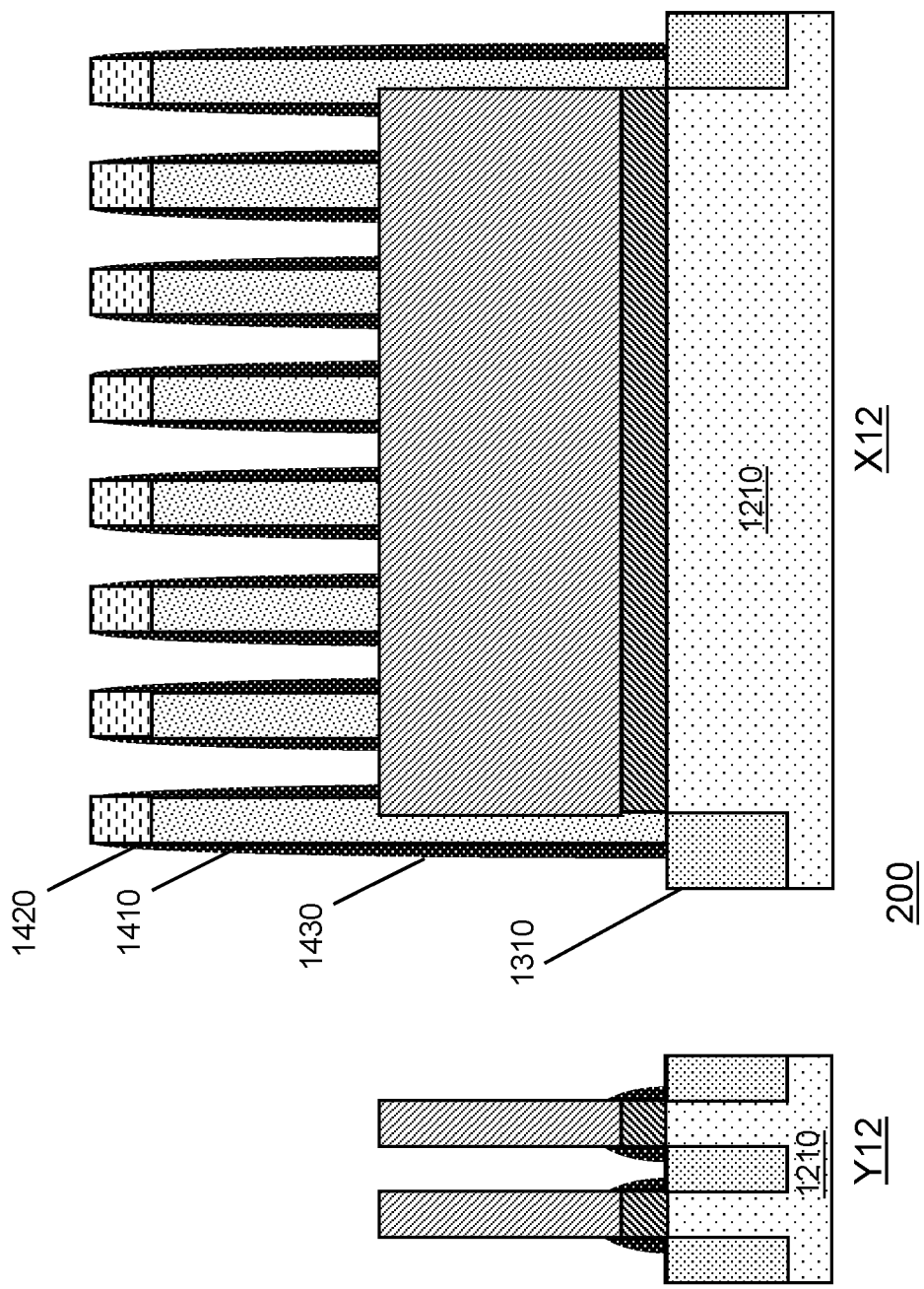
FIG. 14 provides a cross-sectional view of a step in the fabrication of a semiconductor device, according to an embodiment of the invention. The figure illustrates dummy gate structures formed above the stack of layers.

FIG. 14 illustrates device 200 following the forming of at least one dummy gate structure on the nanosheet stack. Eight dummy gates are shown however any number of gates can be formed. Dummy gate structures can be formed by depositing a dummy gate material 1410 over the finFET stack, together with hardmask 1420, and gate sidewall spacers 1430. Formation of the dummy gate then proceeds as described above with respect to FIG. 3.

FIG. 14 further illustrates device 200 following the deposition and subsequent etching, such as anisotropic etching to remove material from horizontal surfaces, of protective gate sidewall spacers 1430 adjacent to the vertical surfaces of dummy gate materials 1410 and hardmask 1420. Formation of gate sidewall spacers 1430 proceeds as described with respect to FIG. 3 above.

Figure 15:
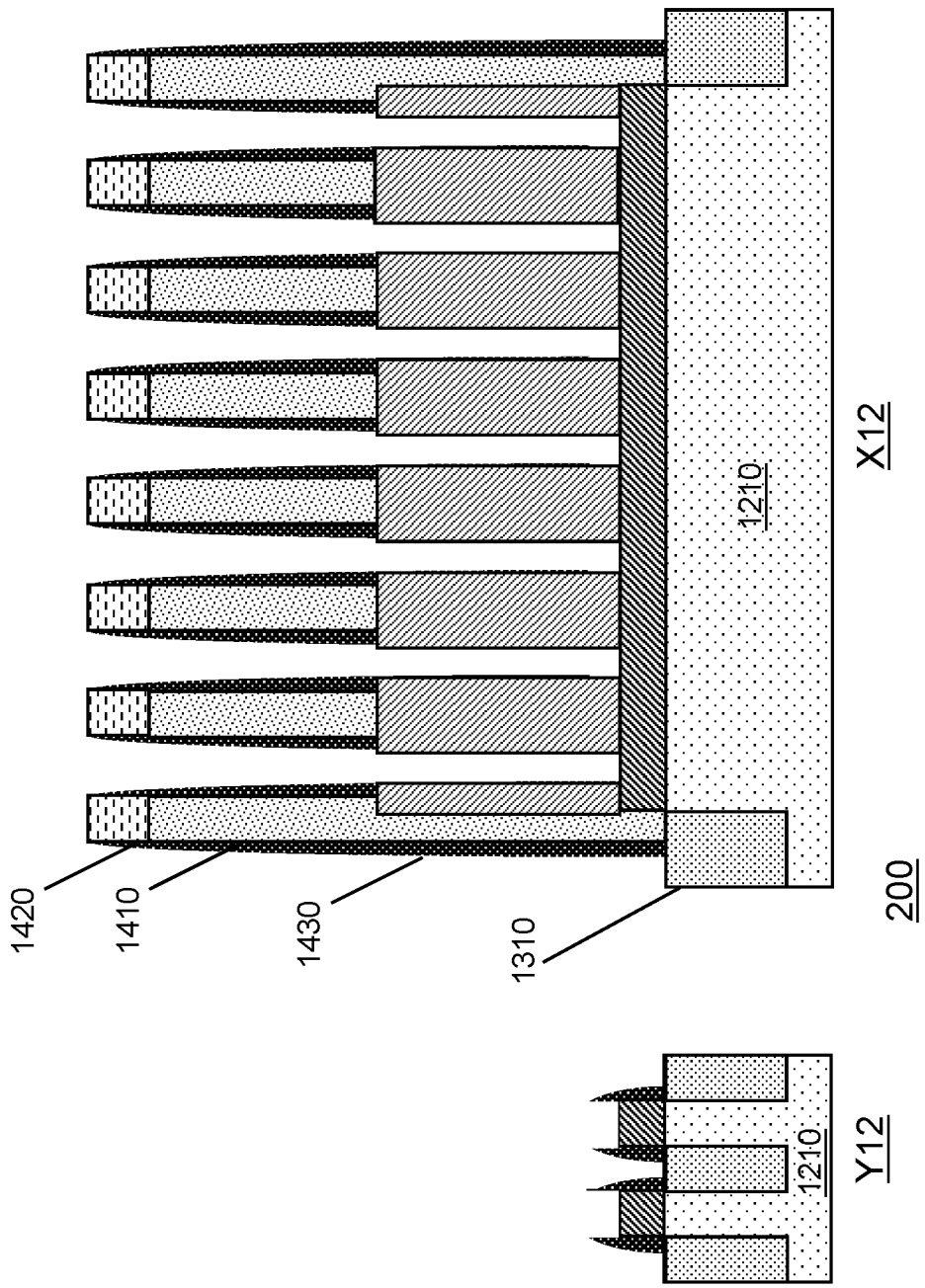
FIG. 15 provides a cross-sectional view, of a step in the fabrication of a semiconductor device, according to an embodiment of the invention. The figure illustrates the device after the formation of device active areas.

FIG. 15 illustrates device 200 following the selective masking and etching of fins between dummy gate structures. Selective etching such as anisotropic RIE, removes portions of the semiconductor layer 1230 from between adjacent dummy gate structures. Protective gate sidewall spacers 1430 prevent damage to the dummy gate structures. The semiconductor layer portions are removed to the upper surface of the sacrificial layer 1220.

Figure 16:
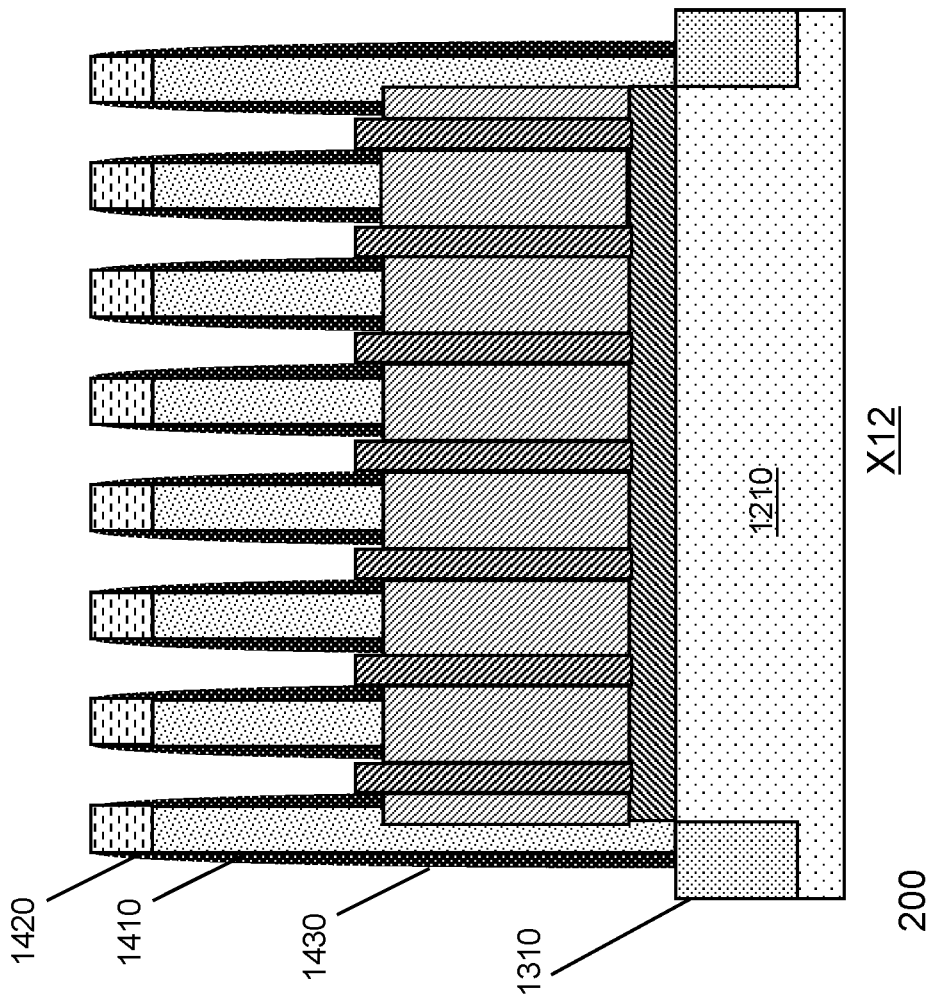
FIG. 16 provides a cross-sectional view of a step in the fabrication of a semiconductor device, according to an embodiment of the invention. The figure illustrates the device after the epitaxial growth of device source-drain regions.

FIG. 16 illustrates device 200 following the epitaxial growth of device source-drain regions starting from sacrificial semiconductor layer 1220 as well as the edges of t channel layers 1230. Material differences between sacrificial layer 1220, source-drain material 1610, and channels 1230 yield differing crystalline lattice structures. Such lattice differences are accommodated by mechanical strains induced in the grown lattices of the source-drain regions 1610 as well as lattice strains in sacrificial layer 1220 and channels 1230. Such lattice strains enhance charge mobility across device elements such as channels 1230, during operation of the FET devices.

In the present embodiments, the source-drain regions 1610 may be doped in situ by adding one or more dopant species to the epitaxial material. The dopant used will depend on the type of FET being formed, whether p-type or n-type. As used herein, "p-type" refers to the addition of impurities to an intrinsic semiconductor that creates deficiencies of valence electrons. In a silicon-containing semiconductor, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous.

Figure 17:
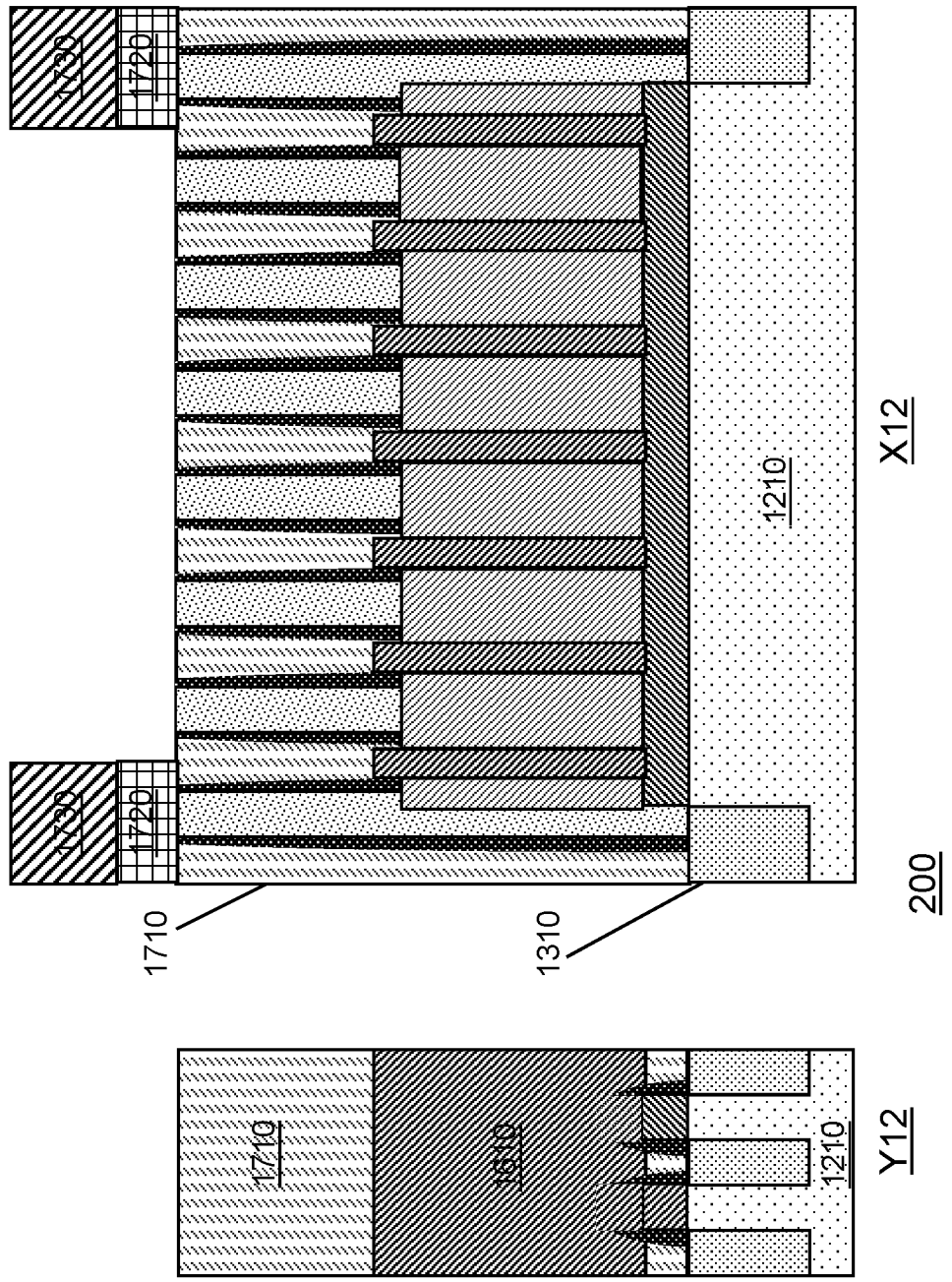
FIG. 17 provides a cross-sectional view of a step in the fabrication of a semiconductor device, according to an embodiment of the invention. The figure illustrates the device after the encapsulation of device active regions with an interlayer dielectric and the formation of protective hardmasks for tuck-under gate structures.

FIG. 17 illustrates device 200 following removal of dummy gate hard masks 1420, and encapsulation of the dummy gates and S/D regions with an interlayer dielectric material 1710, such as flowable silicon oxide, encapsulates the NS stack, S/D regions 1610, including under S/D regions 1610, and dummy gates and gate sidewall spacers 1430. FIG. 17 further illustrates device 200 following formation of protective hardmasks 1720, above edge tuck-under gates, as well as showing organic planarization material 1730 above the protective hardmasks 1720. A material such as SiN may be used for protective caps 1720. OPL material 1730 enables patterning of hardmasks 1720 for selective etching to expose the upper surfaces of dummy gates 1410.

Figure 18:
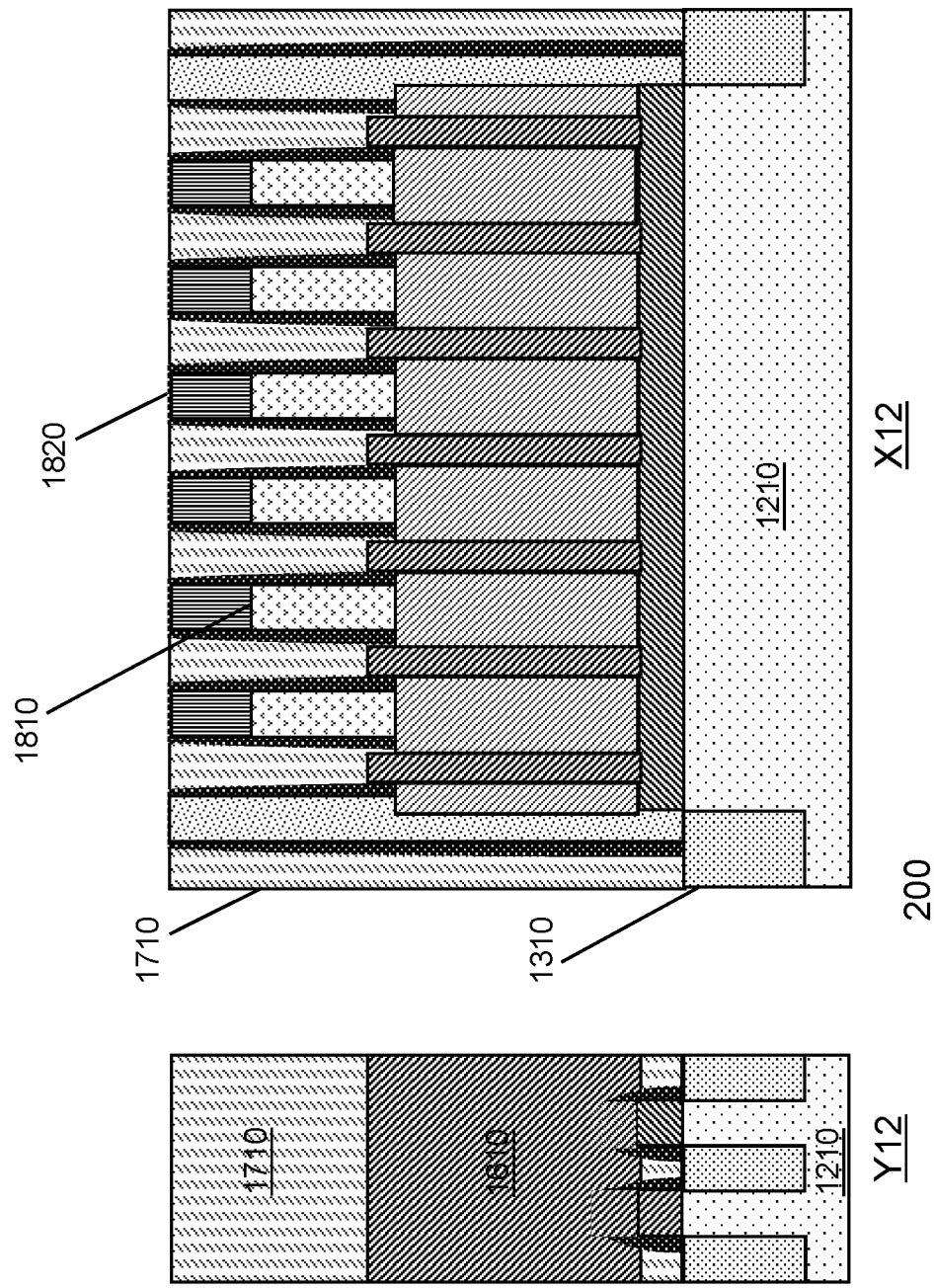
FIG. 18 provides a cross-sectional view of a step in the fabrication of a semiconductor device, according to an embodiment of the invention. The figure illustrates the device after the formation of replacement metal gate structures.

FIG. 18 illustrates device 100 following the removal of dummy gate 1410, and formation of the high-k metal gate (HKMG) stack 1810, and a protective gate cap dielectric 1820. As shown in the Figure, a replacement metal gate structure has been formed in the void space created by removal of the dummy gate 1410. Gate structure 1810 is similar to gate structure 710 described with respect to FIG. 7 above.

Figure 19:
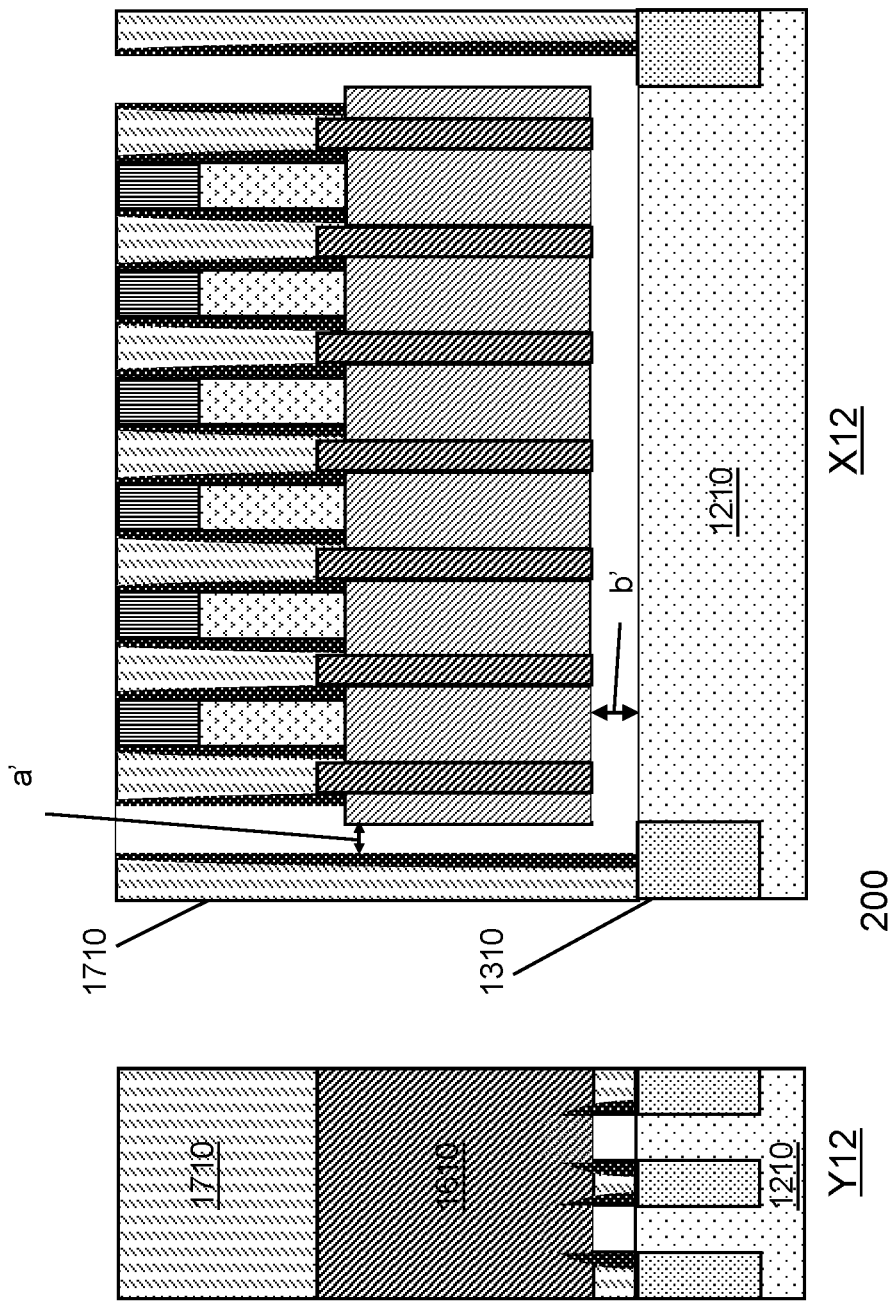
FIG. 19 provides a cross-sectional view of a step in the fabrication of a semiconductor device, according to an embodiment of the invention. The figure illustrates the device after the removal of dummy tuck-under gates and the removal of a sacrificial semiconductor layer.

FIG. 19 illustrates device 200 following release and selective removal of edge dummy gates 1410, portions of STI 1310, and sacrificial layer 1220 from beside and beneath the formed HKMG structures. As described above with reference to FIG. 8. FIG. 19 further illustrates cross-section dimensions a', and b', of the void space.

Figure 20:
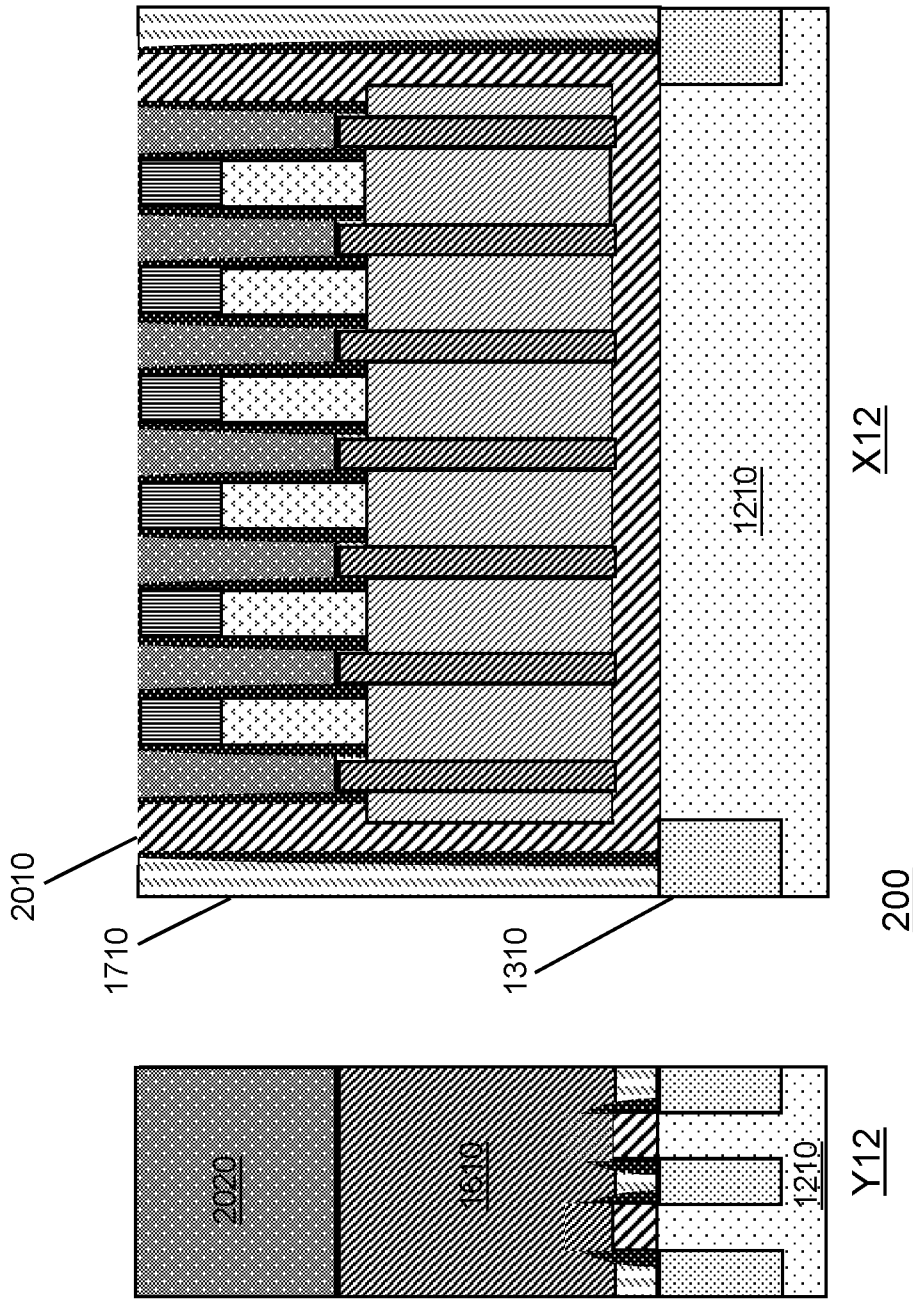
FIG. 20 provides a cross-sectional view of a step in the fabrication of a semiconductor device, according to an embodiment of the invention. The figure illustrates the device after the deposition of a bottom dielectric isolation material in the bottom and side voids.

FIG. 20 illustrates device 200 following deposition of BDI material 2010 as well as the formation of trench metal regions 2020 above the S/D regions 1610 of the FET devices. Trench metal formation includes masking outer ILD 1710 portions using an OPL layer and selectively removing ILD material above the S/D regions 1610 of the device.

As shown in FIG. 20, a trench metal deposition process yields a metallized layer 2020 adjacent to and above the S-D region 1610, and gate sidewall spacers 1430. In an embodiment, formation of the trench metal layer 2020 includes forming a silicide layer between contact and epitaxial grown S/D regions 1610 (e.g., Ni silicide, Ti silicide, NiPt silicide, Co silicide, etc.) followed by forming metallization materials above the silicide (e.g., a thin adhesion metal such as TiN and a bulk metal fill such as Co, W, etc., followed by CMP.

In an embodiment, conformal deposition of a low-k material such as SiOC, SiOCN, SiBCN, SiO2, etc., may be deposited in the formed continuous vertical and horizontal void space to provide electrical isolation to the FET S/D regions. In an embodiment, a dielectric stressor material such as a silicon nitride is deposited using PEALD or PECVD to fill the void space. Formation of the BDI from the stressor dielectric applies stress to the S/D regions and through those regions to the channels 1230, of the device.

Figure 21:
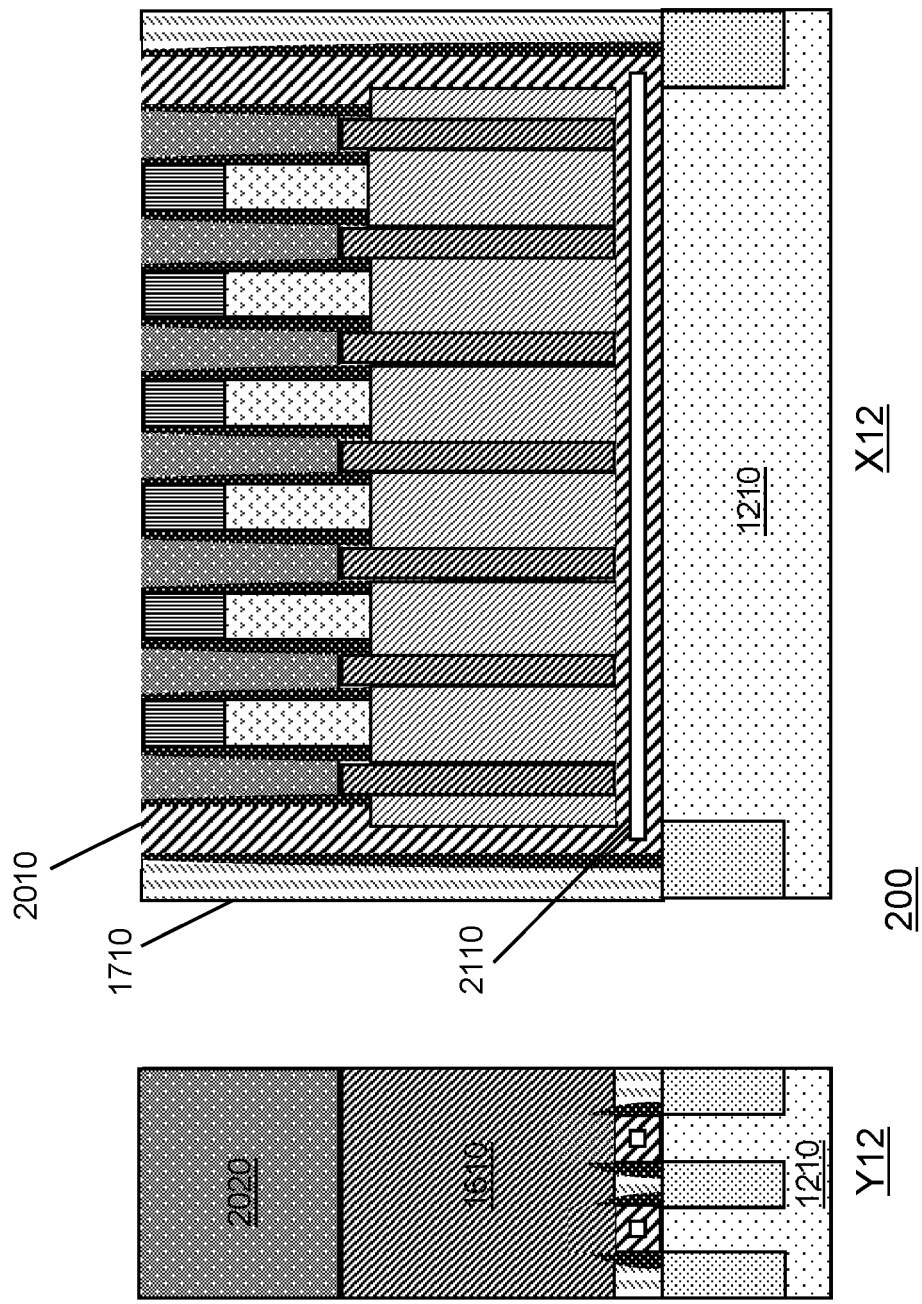
FIG. 21 provides a cross-sectional view of a step in the fabrication of a semiconductor device, according to an embodiment of the invention. The figure illustrates the device after the deposition of a bottom dielectric isolation material.

FIG. 20 illustrates an embodiment wherein dimensions a' and b' are similar in magnitude, or wherein a' exceeds b', such that the horizontal portions of the void space completely fills with BDI material 2010. FIG. 21 illustrates an embodiment wherein dimension a' is less than b'. In this embodiment, the vertical gates fill before the entire horizontal void space fills, resulting in the formation of the BDI including airgap 2110.

Figure 22A:
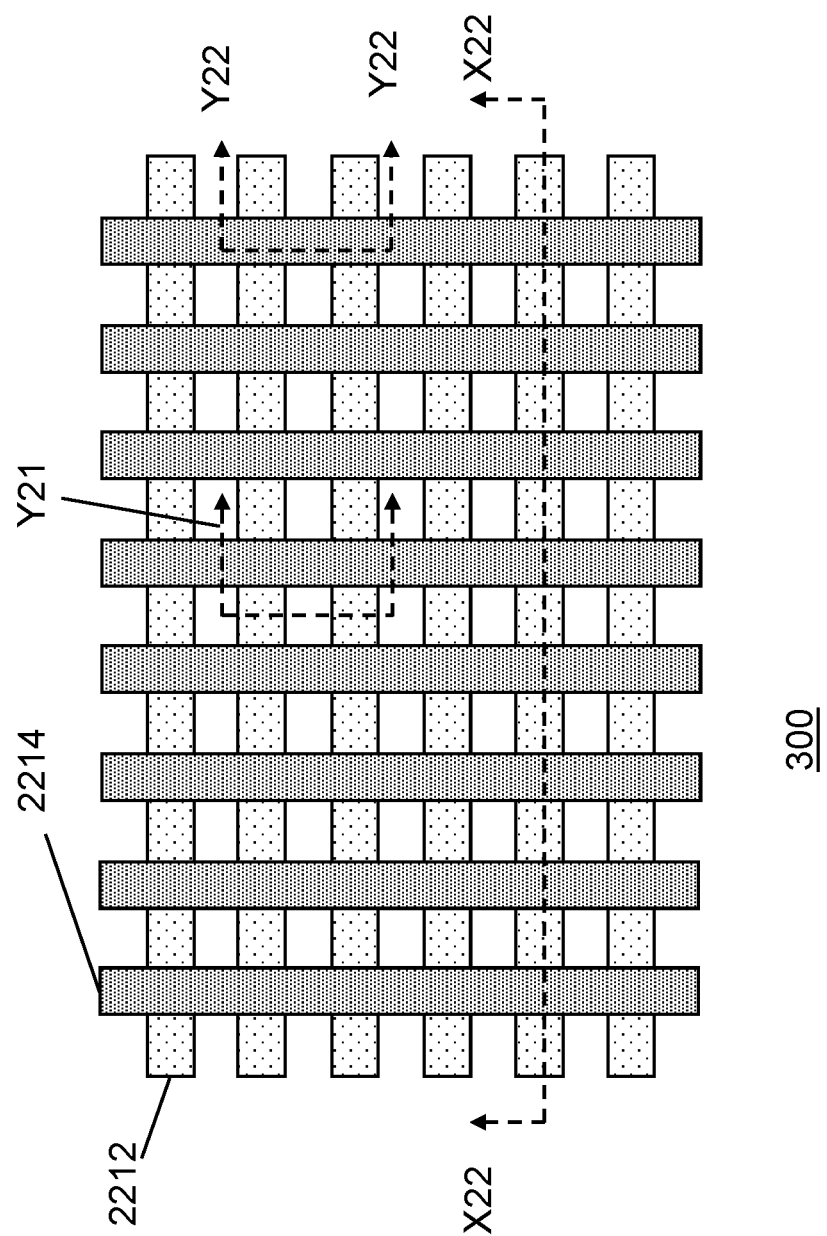
FIG. 22A provides a plan view of a semiconductor device, according to an embodiment of the invention. The figure illustrates the section lines used for the respective views of FIGS. 22-33.

FIG. 22A provides a schematic plan view of a device 300, according to an embodiment of the invention. As shown in the Figure, gate structures 2214, are disposed perpendicular to nanosheet stacks 2212. Section lines X22, Y21, and Y22, indicate the viewpoints of the respective views of FIGS. 22-33.

Figure 22B:
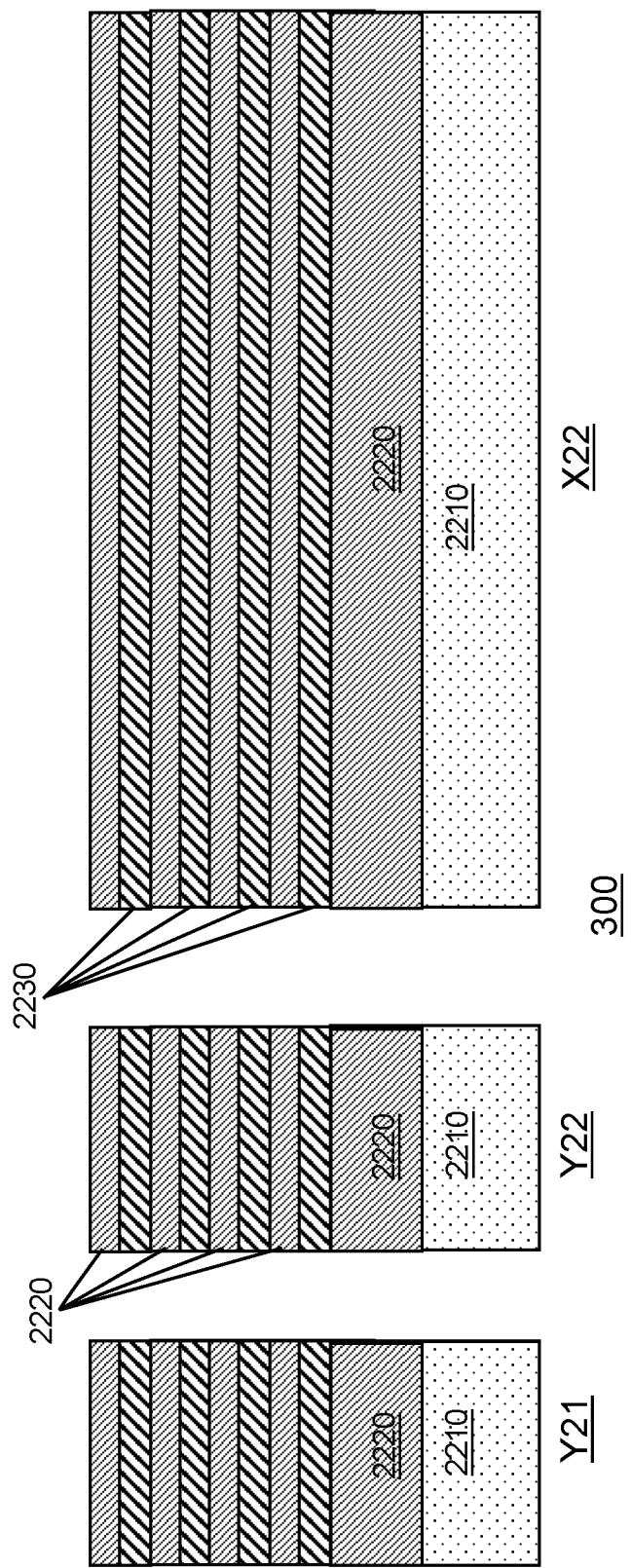
FIG. 22B provides a cross-sectional view of a step in the fabrication of a semiconductor device, according to an embodiment of the invention. The figure illustrates the formation of stacks of nanosheets of alternating materials.

FIG. 22B provides a schematic view of a device 300 according to an embodiment of the invention following the deposition of a stack of layers for the formation of FET device nanosheets. In an embodiment, the stack includes alternating layers of epitaxially grown silicon germanium 2220, and silicon 2230. Other materials having similar properties may be used in place of the SiGe and Si.

The nanosheet stack includes a bottom-most layer of a first semiconductor material, such as Si and alternating layers of a second semiconductor material, such as SiGe.

The nanosheet stack is depicted with nine layers (four SiGe layers and four Si layers forming a device, and a thick SiGe layer separating the device stack from the underlying semiconductor substrate 2210. However, any number and combination of layers can be used so long as the layers alternate between SiGe and Si to form a device and include a thick SiGe layer separating the device from the substrate. The nanosheet stack is depicted with the layers being in the form of nanosheets, however the width of any given nanosheet layer can be varied so as to result in the form of a nanowire, a nanoellipse, a nanorod, etc. SiGe layers 2220, can be composed of, for instance, $SiGe_{15-35}$, examples thereof including, but not limited to $SiGe_{15}$, $SiGe_{20}$, $SiGe_{25}$ . . . $SiGe_{35}$.

Substrate 2210 can be composed of any currently known or later developed semiconductor material, as described above with respect to substrate 110.

In an embodiment, each sacrificial semiconductor material layer 2220, is composed of a first semiconductor material which differs in composition from at least an upper portion of the semiconductor substrate 2210. In one embodiment, the upper portion of the semiconductor substrate 2210 is composed of silicon, while each sacrificial semiconductor material layers 2220 is composed of a silicon germanium alloy. In such an embodiment, the SiGe alloy comprising each sacrificial semiconductor material layer 2220 has a germanium content that is less than 45 atomic percent germanium. In one example, the SiGe alloy comprising each sacrificial semiconductor material layer 2220 has a germanium content from 15 atomic percent germanium to 35 atomic percent germanium. The first semiconductor material comprising each sacrificial semiconductor material layer 2220 can be formed utilizing an epitaxial growth (or deposition process).

Each semiconductor channel material layer 2230, is composed of a second semiconductor material that has a different etch rate than the first semiconductor material of the sacrificial semiconductor material layers 2220 and is also resistant to Ge condensation. The second semiconductor material of each semiconductor channel material layer 2230, may be the same as, or different from, the semiconductor material of at least the upper portion of the semiconductor substrate 2210.

In one example, at least the upper portion of the semiconductor substrate 2210 and each semiconductor channel material layer 2230 is composed of Si or a III-V compound semiconductor, while each sacrificial semiconductor material layer 222 is composed of a silicon germanium alloy. The second semiconductor material of each semiconductor channel material layer 2230, can be formed utilizing an epitaxial growth (or deposition process).

Figure 23:
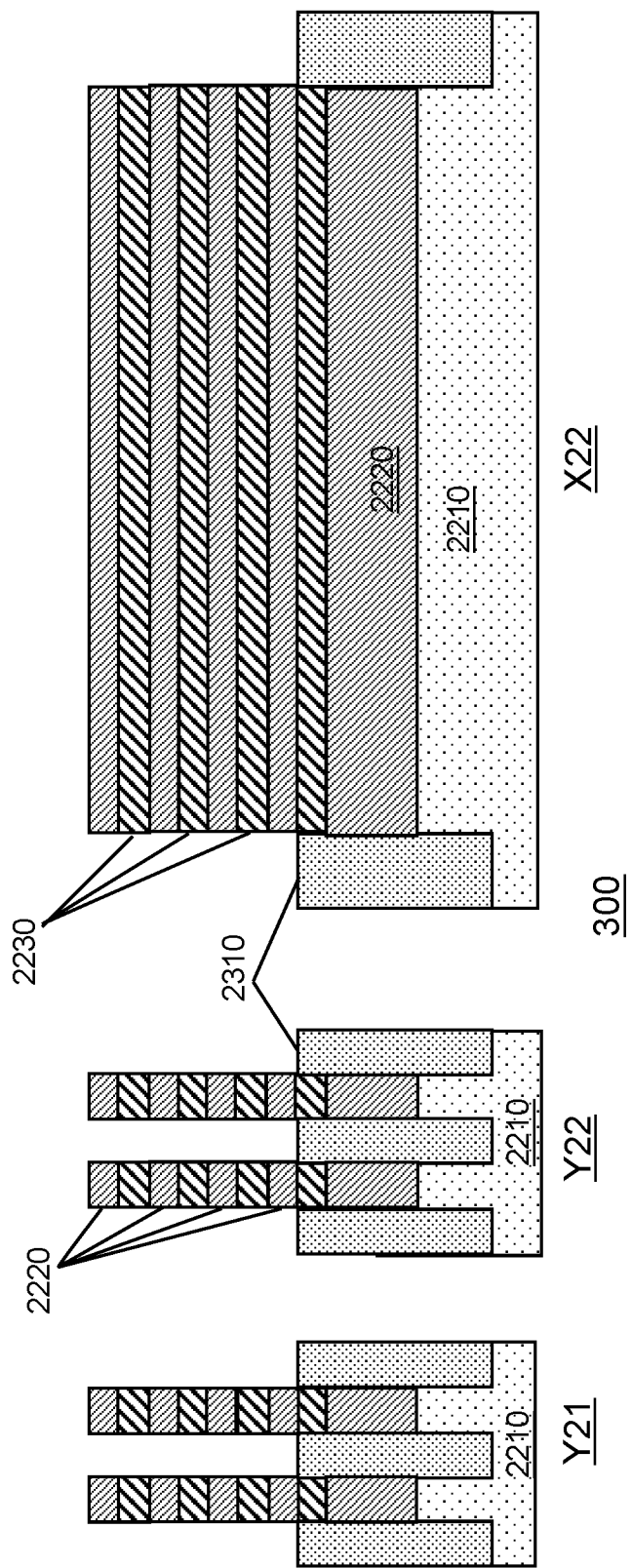
FIG. 23 provides a cross-sectional view of a step in the fabrication of a semiconductor device, according to an embodiment of the invention. The figure illustrates the device after the masking and selective recessing of the nanosheet stacks.

FIG. 23 illustrates device 300 following the patterning, masking and selective etching of the stack of nanosheet layers to form individual nanosheet fin stacks. In an embodiment, the stack includes alternating layers of epitaxially grown silicon germanium 2220, and silicon 2230. Other materials having similar properties may be used in place of the SiGe and Si. In an embodiment, reactive ion etching recesses exposed nanosheet stack portions yielding the desired nanosheet stack fins.

In an embodiment, the etching proceeds into substrate 2210. Deposition of a shallow trench isolation material 2310, such as silicon dioxide, or any suitable combination of multiple dielectric materials (e.g., silicon nitride and silicon oxide), occurs after the formation of shallow trench isolation (STI) regions 2310 between nanosheet stack circuit elements of the device. Following such deposition, an oxide recess process trims the upper surface of STI regions 2310 to the level of the bottom semiconductor layer 2230, and chemical mechanical planarization (CMP) processes smooth the upper surface of STI regions 2310 in preparation for the subsequent fabrication steps. STI regions 2310 provide electrical isolation between source/drain regions of adjacent NS transistors.

Figure 24:
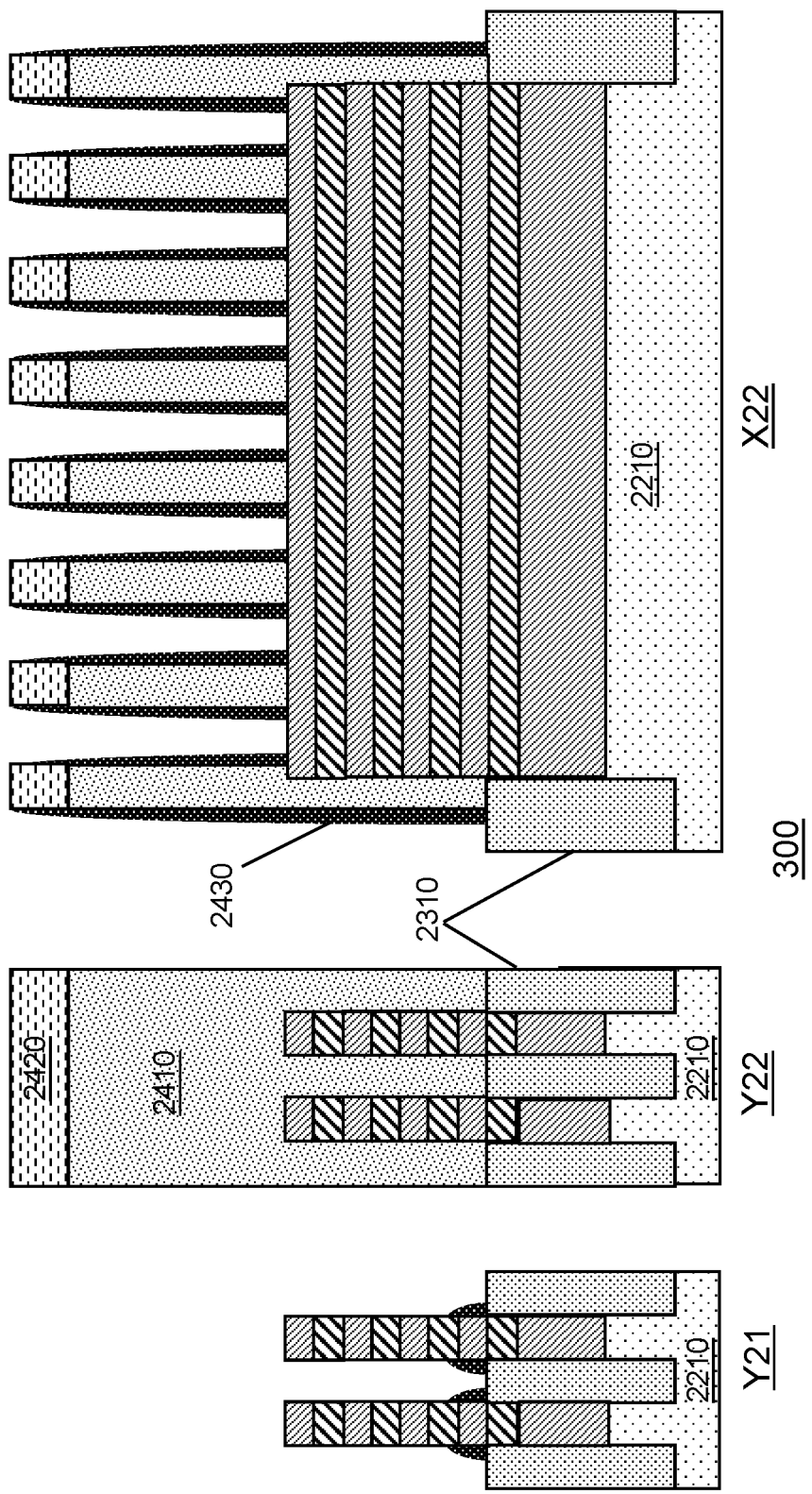
FIG. 24 provides a cross-sectional view of a step in the fabrication of a semiconductor device, according to an embodiment of the invention. The figure illustrates dummy gate structures formed above the stack of nanosheet layers.

FIG. 24 illustrates device 300 following the forming of at least one dummy gate structure on the nanosheet stack. Eight dummy gates are shown however any number of gates can be formed. Dummy gate structures can be formed by depositing a dummy gate material 2410 over the nanosheet stack, as described with reference to FIG. 3 above. After that, a hardmask layer 2420 is deposited over the dummy gate, followed by lithographic patterning and masking and selective etching processes.

Hard mask 2420 includes a nitride, oxide, an oxide-nitride bilayer, or another suitable material. In some embodiments, the hardmask 2420 may include an oxide such as silicon oxide (SiO), a nitride such as silicon nitride (SiN), an oxynitride such as silicon oxynitride (SiON), combinations thereof, etc. In some embodiments, the hardmask 2420 is a silicon nitride such as $Si_3N_4$.

FIG. 24 further illustrates device 300 following the deposition and subsequent etching, such as anisotropic etching to remove material from horizontal surfaces, of protective dielectric gate sidewall spacers 2430 adjacent to the vertical surfaces of dummy gate materials 2410 and hardmask 2420. In an embodiment, gate sidewall spacer material 2430, may be the same material as hardmask 2420, or may be different materials and may be comprised of any one or more of a variety of different insulative materials, such as $Si_3N_4$, SiBCN, SiNC, SiN, SiCO, $SiO_2$, SiNOC, etc. In this embodiment, after conformal deposition, selective etching, such as anisotropic reactive ion etching, removes spacer material 2430 from horizontal surfaces of the intermediate stage of the device 300.

Figure 25:
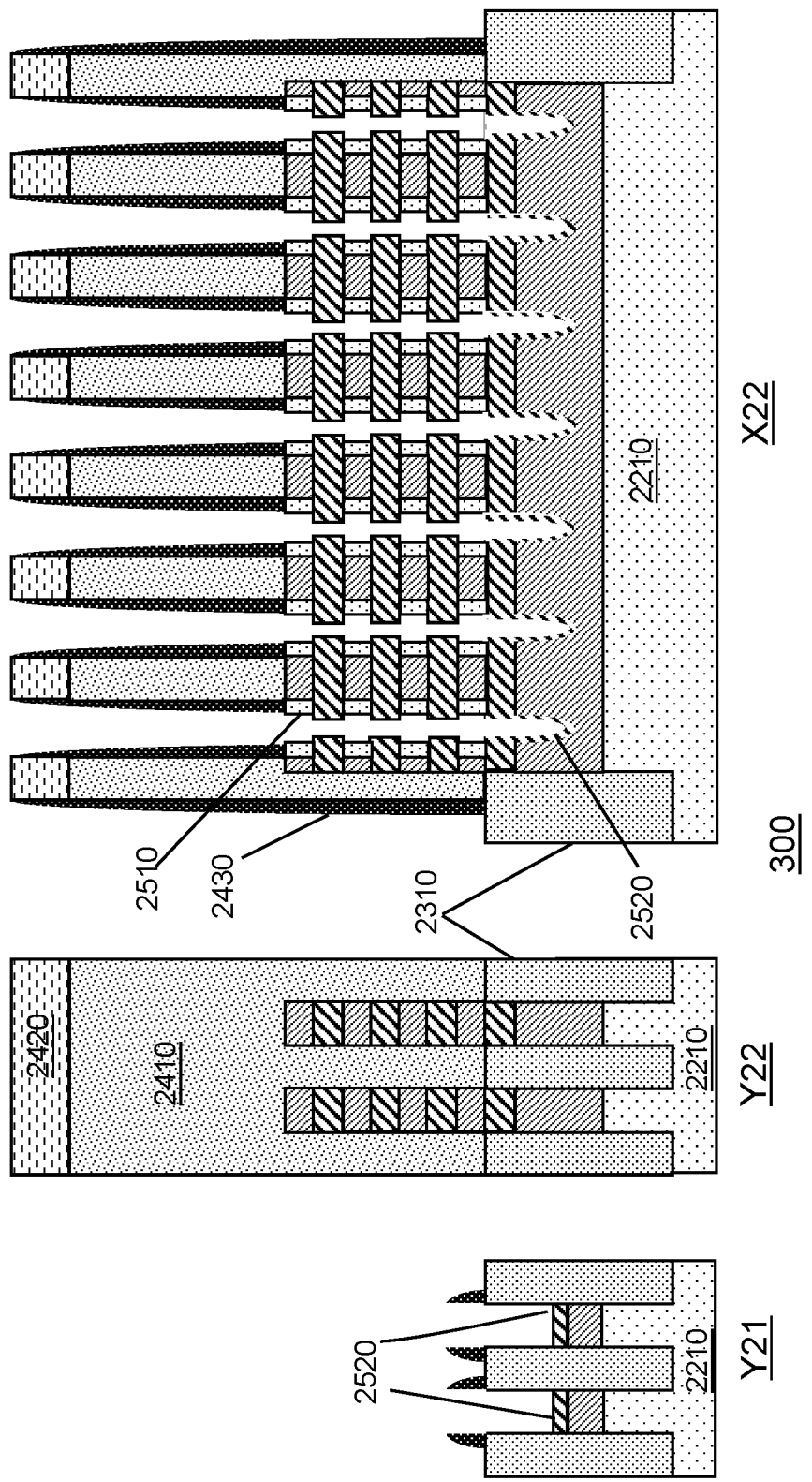
FIG. 25 provides a cross-sectional view, of a step in the fabrication of a semiconductor device, according to an embodiment of the invention. The figure illustrates the device after the formation of device active areas and the deposition of an epitaxially grown buffer layer.

FIG. 25 illustrates device 300 following the selective masking and etching of nanosheets between dummy gate structures, and the formation of inner spacers between adjacent nanosheet channel layers 2230, yielding individual gate structures. Selective anisotropic etching such as RIE, removes portions of the alternating sacrificial layers 2220 and channel layers 2230 from between adjacent dummy gate structures. Protective gate sidewall spacers 2430 prevent damage to the dummy gate structures. The nanosheet layer portions are removed to the upper surface of the lowest semiconductor layer 2230.

FIG. 25 further illustrates device 300 following formation of inner spacers between nanosheets of the respective FET devices. Portions of nanosheet stack layers 2230, and 2220, which are not underneath gate sidewall spacers 2430 and not underneath dummy gate 2410 are recessed. Etching generally refers to the removal of material from a substrate (or structures formed on the substrate) and is often performed with a mask in place so that material may selectively be removed from certain areas of the substrate, while leaving the material unaffected, in other areas of the substrate. Etching proceeds below the nanosheet stack into the thick sacrificial layer 2220, above substrate 2210.

After generally etching the nanosheet stack, a selective etching of SiGe layers 2220 of the nanosheet stack removes portions which are underneath gate sidewall spacers 2430. Inner spacers 2510 are then formed in etched portions and thus are located under gate sidewall spacers 2430. Inner spacers 2510 can be composed of any suitable dielectric material, for example $Si_3N_4$, SiBCN, SiNC, SiN, SiCO, SiO₂, SiNOC, etc. The inner spacer is formed by a conformal dielectric liner deposition followed by isotropic etching back, so dielectric liner is removed everywhere except the regions pinched-off in those under spacer cavities.

After forming inner spacers 2510, a semiconductor buffer layer 2520 is epitaxially grown upon the exposed surfaces of the thick sacrificial layer 2220, as well as the exposed edges of the nanosheet channels 2230. The buffer layer may be a pure or doped semiconductor.

Figure 26:
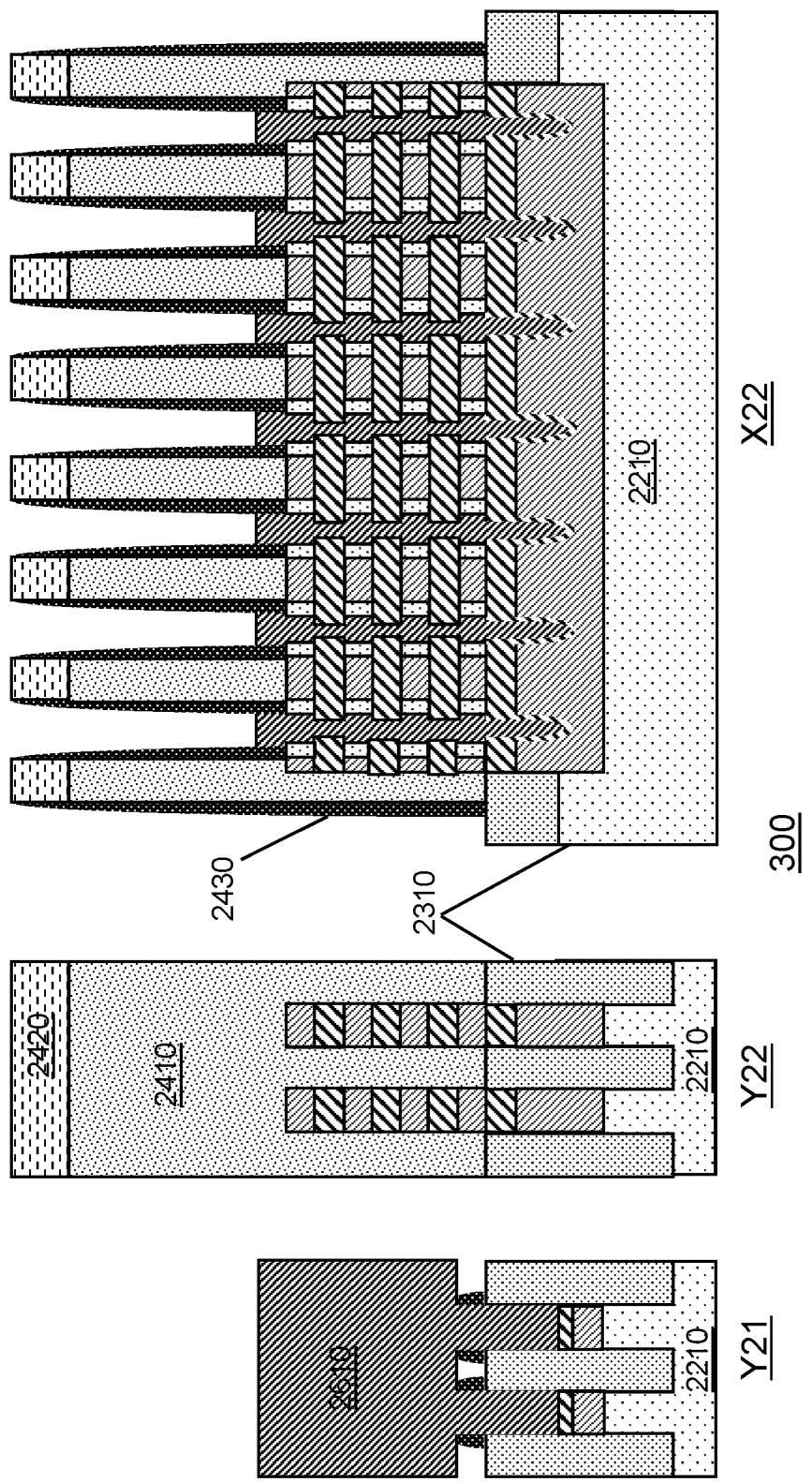
FIG. 26 provides a cross-sectional view of a step in the fabrication of a semiconductor device, according to an embodiment of the invention. The figure illustrates the device after the epitaxial growth of device source-drain regions.

FIG. 26 illustrates device 300 following the epitaxial growth of device source-drain regions 2610, starting from semiconductor buffer layer 2520 as well as the edges of nanosheet channel layers 2230.

Material differences between buffer layer 2520, source-drain material 2610, and nanosheet channels 2230 yield differing crystalline lattice structures. Such lattice differences are accommodated by mechanical strains induced in the grown lattices of the source-drain regions 2610 as well as lattice strains in buffer layer 2520 and nanosheet channels 2230. Such lattice strains enhance charge mobility across device elements such as channel nanosheets 2230, during operation of the FET devices.

In the present embodiments, the source-drain regions 2610 may be doped in situ by adding one or more dopant species to the epitaxial material. The dopant used will depend on the type of FET being formed, whether p-type or n-type. As used herein, "p-type" refers to the addition of impurities to an intrinsic semiconductor that creates deficiencies of valence electrons. In a silicon-containing semiconductor, examples of p-type dopants, i.e., impurities, include but are not limited to boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous.

Figure 27:
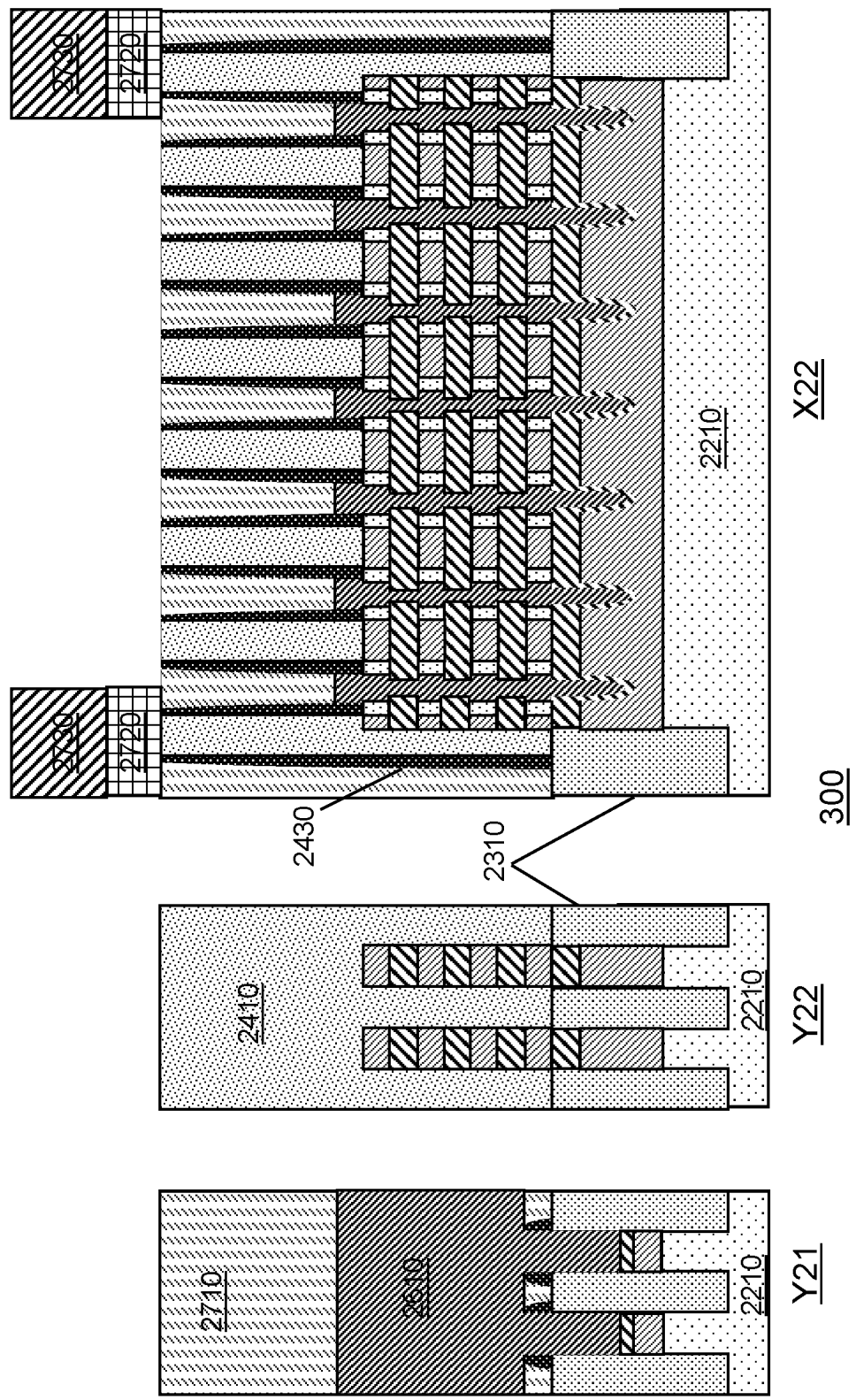
FIG. 27 provides a cross-sectional view of a step in the fabrication of a semiconductor device, according to an embodiment of the invention. The figure illustrates the device after the encapsulation of device active regions with an interlayer dielectric and the formation of protective hardmasks for tuck-under gate structures.

FIG. 27 illustrates device 300 following removal of dummy gate hard masks 2420, and encapsulation of the dummy gates 2410 and S/D regions 2610 with an interlayer dielectric material 2710, such as flowable silicon oxide, encapsulates the NS stack, S/D regions 2610, including under S/D regions 2610, and dummy gates and gate sidewall spacers 2430. FIG. 27 further illustrates device 300 following formation of protective hardmask 2720, above edge tuck-under gates, as well as showing organic planarization material 2730 above the protective hardmasks 2720. A material such as SiN may be used for protective caps 2720. OPL material 2730 enables patterning of hardmasks 2720 for selective etching to expose the upper surfaces of dummy gates 2410.

Figure 28:
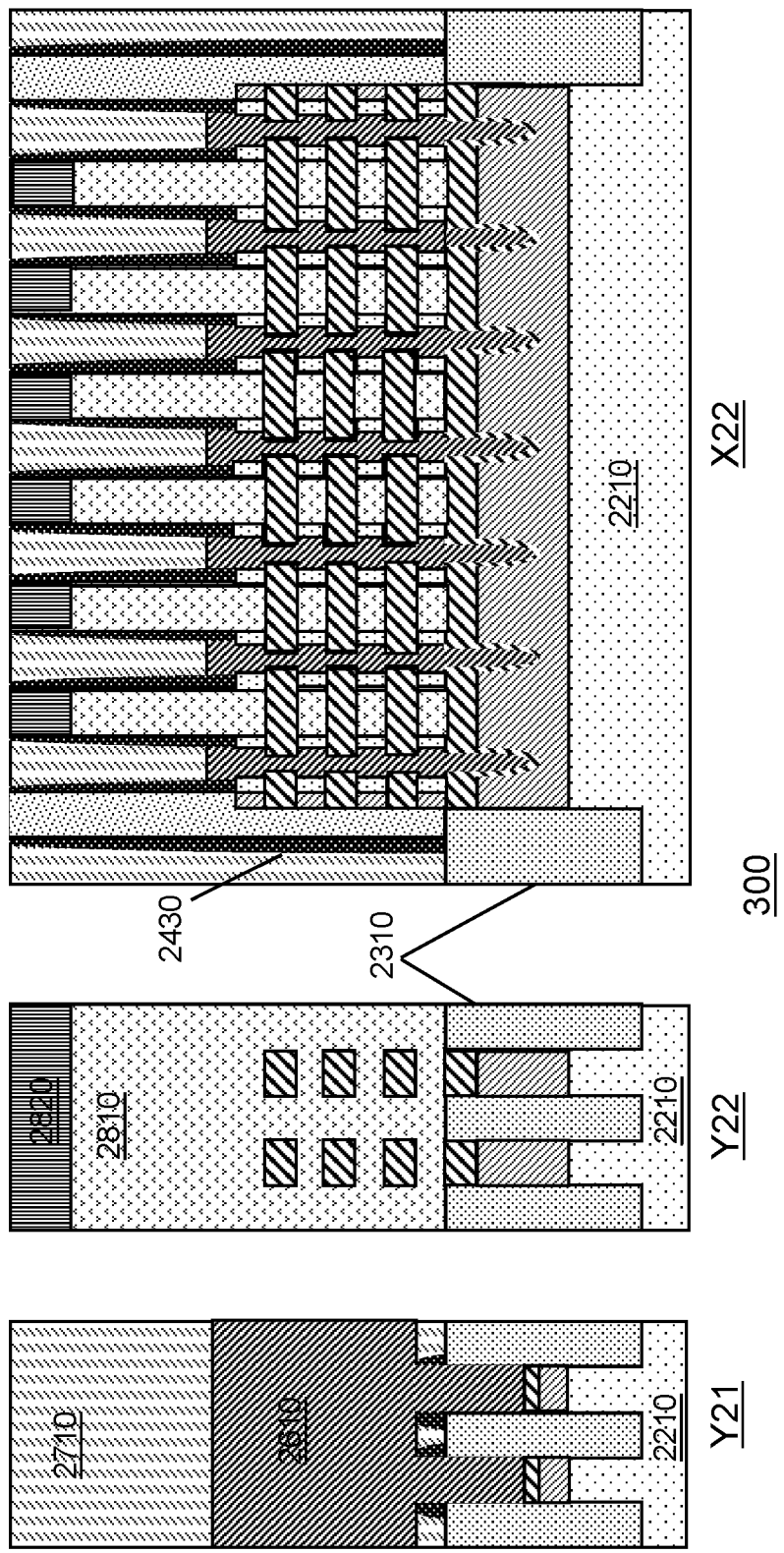
FIG. 28 provides a cross-sectional view of a step in the fabrication of a semiconductor device, according to an embodiment of the invention. The figure illustrates the device after the formation of replacement metal gate structures.

FIG. 28 illustrates device 300 following the removal of dummy gate 2410, sacrificial SiGe 2220, and formation of the high-k metal gate (HKMG) stack 2810, and a protective gate cap dielectric 2820. As shown in the Figure, a replacement metal gate structure has been formed in the void space created by removal of the dummy gate 2410, and sacrificial SiGe 2220. Gate structure 2810 includes gate dielectric and gate metal layers as described with regard to FIG. 7 above.

Figure 29:
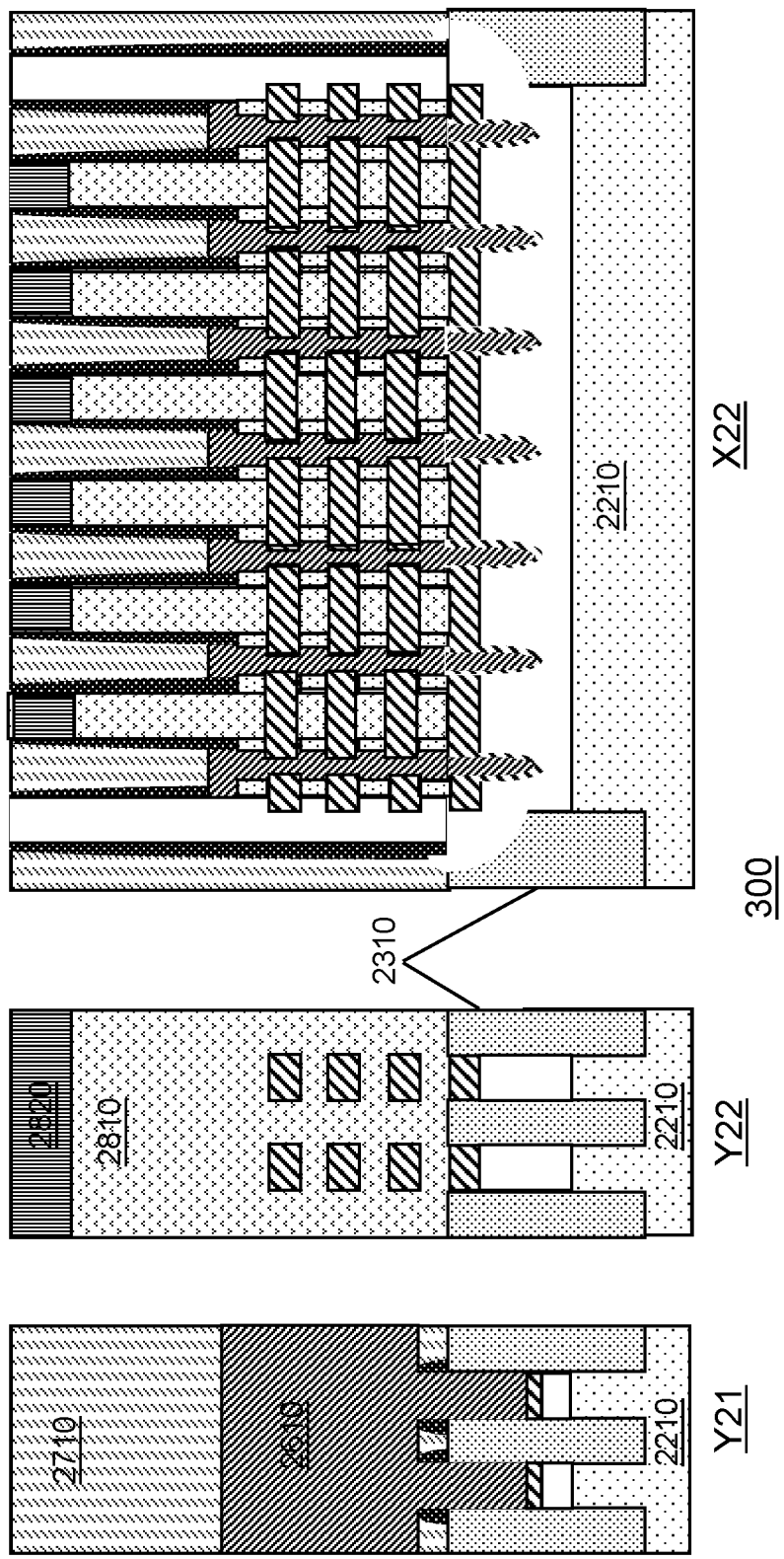
FIG. 29 provides a cross-sectional view of a step in the fabrication of a semiconductor device, according to an embodiment of the invention. The figure illustrates the device after the removal of dummy tuck-under gates, the recessing of shallow trench isolation regions and the removal of a sacrificial semiconductor layer.

FIG. 29 illustrates device 300 following release and selective removal of edge dummy gates 2410, portions of STI 2310, and sacrificial layer 2220 from beside and beneath the formed HKMG structures.

Figure 30:
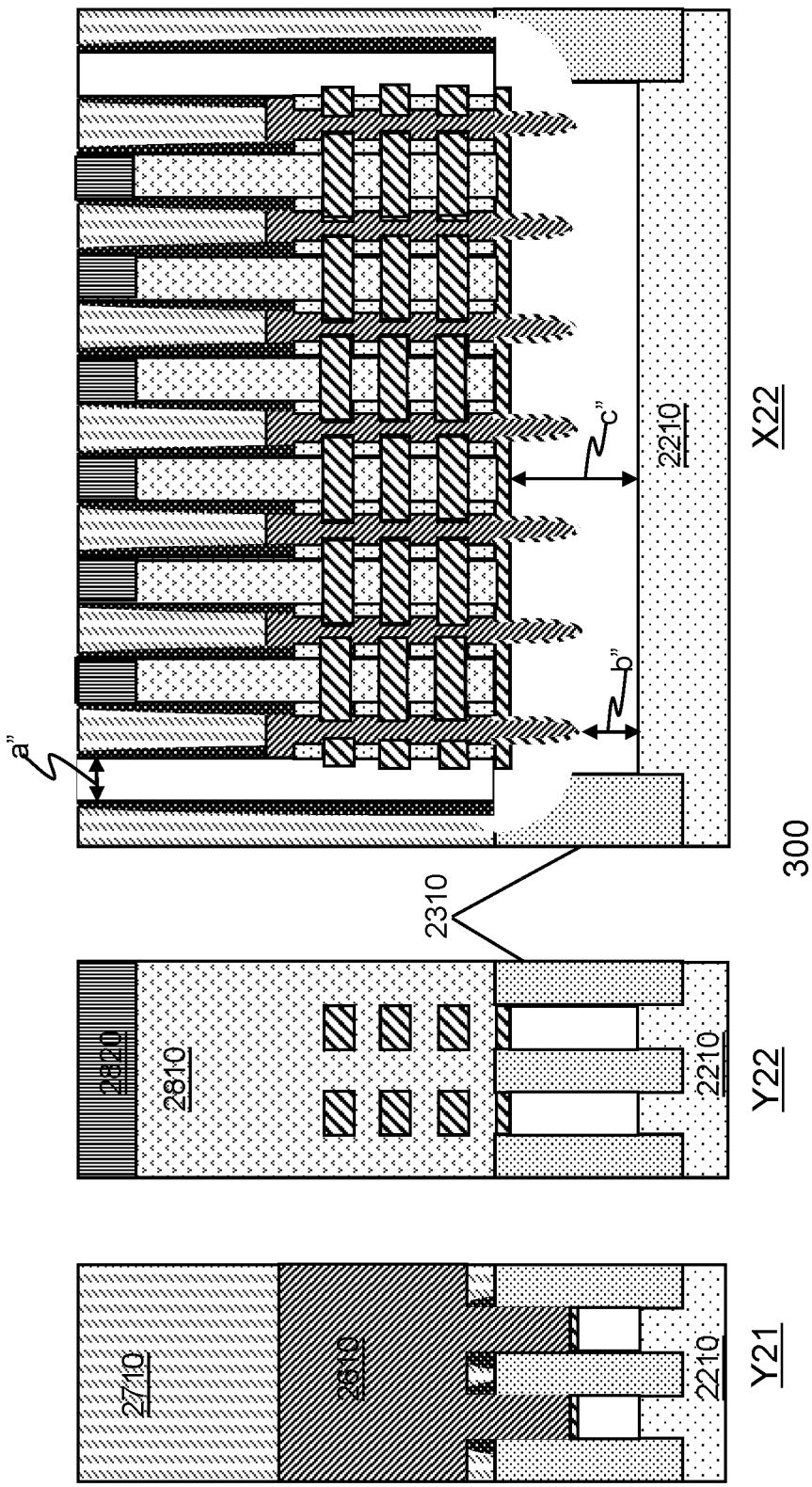
FIG. 30 provides a cross-sectional view of a step in the fabrication of a semiconductor device, according to an embodiment of the invention. The figure illustrates the device after the expansion of the bottom void by thinning the bottom device channels.

FIG. 30 illustrates device 300 following an optional expansion of the void space left after removal of dummy gate materials 2410, STI 2310, and sacrificial layer 2220 from the structure. Such an enlargement of the space provides increased volume for bottom dielectric isolation materials t better isolate S/D regions across the device. As shown in the Figure, exposed portions of nanosheet channels 2230 and sacrificial layers 2220, are also removed enlarging the vertical tuck-under gate regions on the left and right edges of the device structure. Expanding the space thins the bottom semiconductor layer 2230 beneath the HKMG stacks, reducing the possibility of parasitic S/D leakage current through this layer. Buffer layers 2520 are also thinned at this stage. FIG. 30 further illustrates cross-section dimensions a", b", and c" of the void space.

Figure 31:
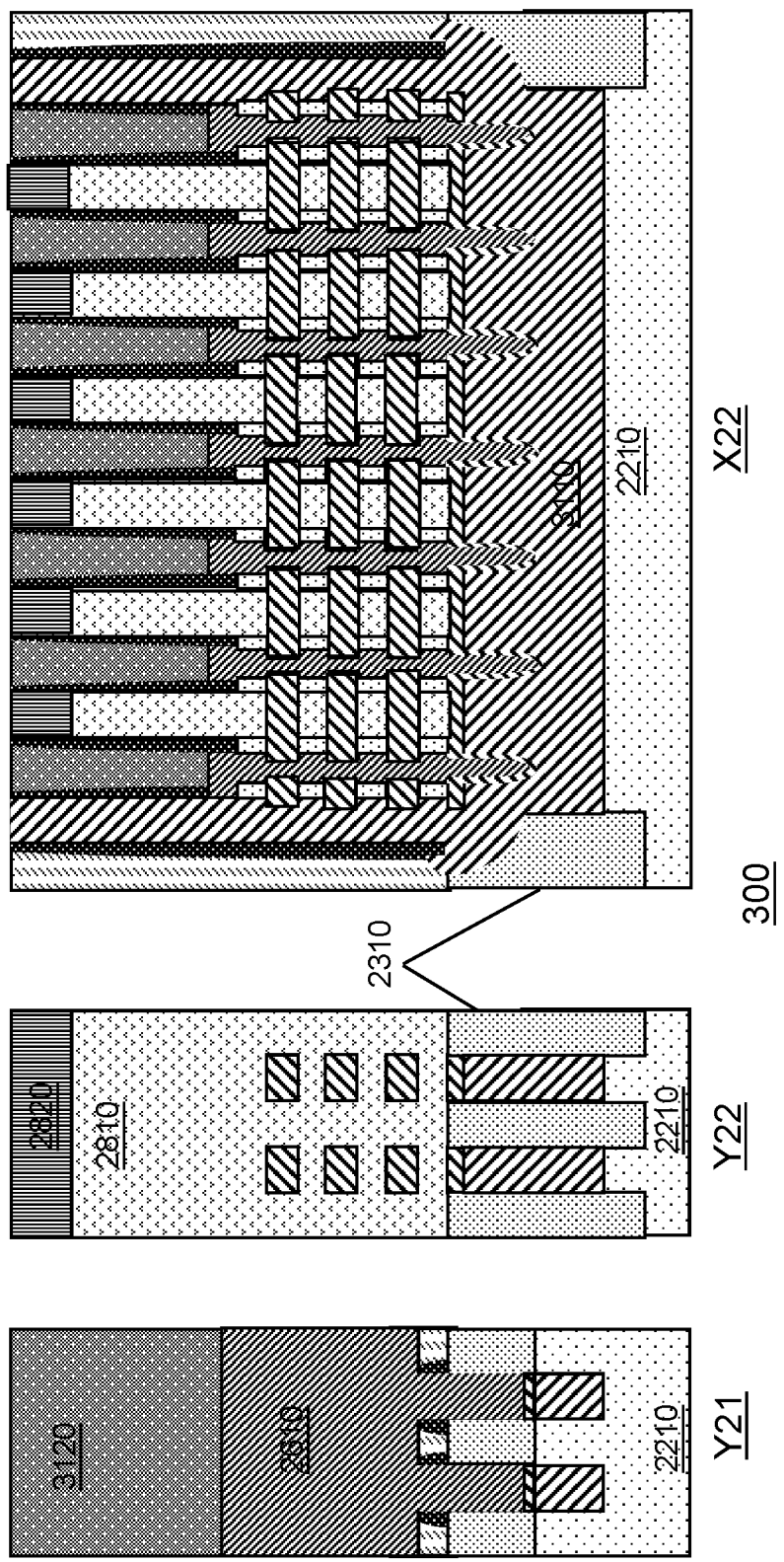
FIG. 31 provides a cross-sectional view of a step in the fabrication of a semiconductor device, according to an embodiment of the invention. The figure illustrates the device after the deposition of a bottom dielectric isolation material in the bottom and side voids.

FIG. 31 illustrates device 300 following deposition of BDI material 3110 as well as the formation of trench s metal regions 3120 above the S/D regions 2610 of the FET devices. A trench silicide (TS) process yields a metallized layer adjacent to and above the S-D region 2610, and gate sidewall spacers 2430. In an embodiment, formation of the trench metal layer 3120 includes forming a silicide layer between contact and epitaxial grown S/D regions 2610 (e.g., Ni silicide, Ti silicide, NiPt silicide, Co silicide, etc.) followed by forming metallization materials above the silicide (e.g., a thin adhesion metal such as TiN and a bulk metal fill such as Co, W, etc., followed by CMP.

In an embodiment, conformal deposition of a low-k material such as SiOC, SiOCN, SiBCN, SiO2, etc., may be deposited in the formed void space to provide electrical isolation to the FET S/D regions. In an embodiment, a dielectric stressor material such as a silicon nitride is deposited using PEALD or PECVD to fill the void space. Formation of the BDI from the stressor dielectric applies stress to the S/D regions and through those regions to the nanosheet channels 2230, of the device.

Figure 32:
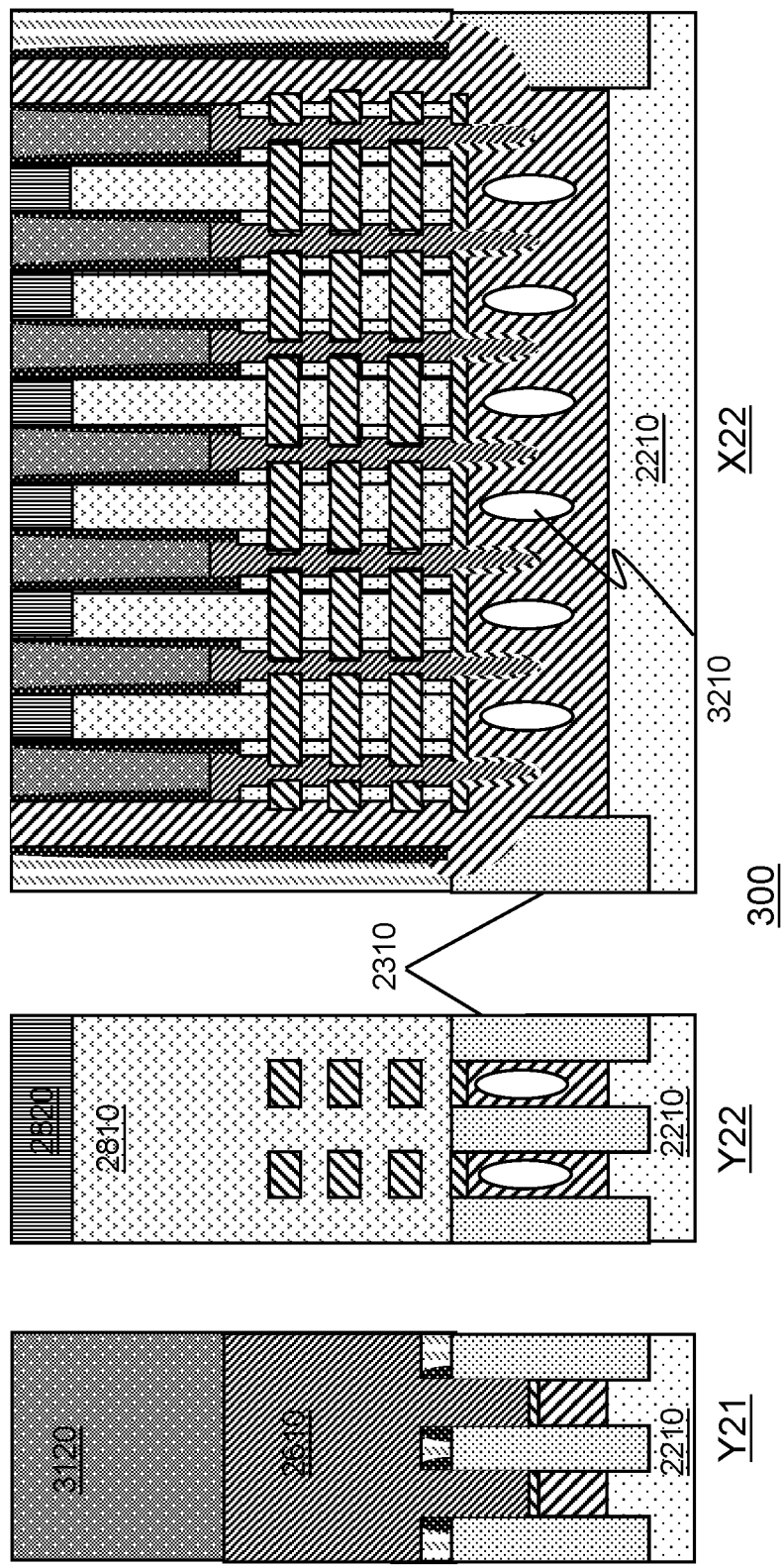
FIG. 32 provides a cross-sectional view of a step in the fabrication of a semiconductor device, according to an embodiment of the invention. The figure illustrates the device after the deposition of a bottom dielectric isolation material.
Figure 33:
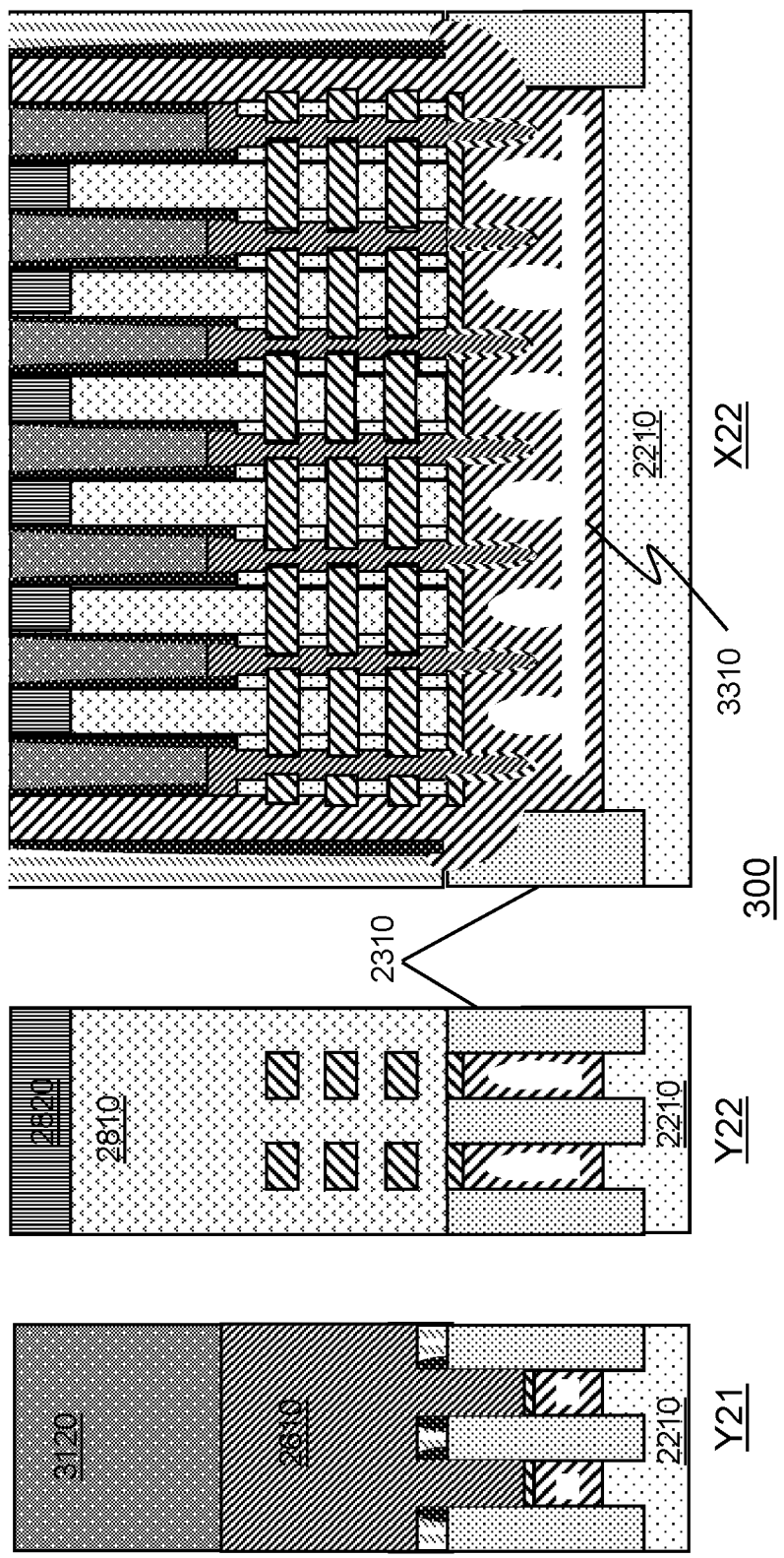
FIG. 33 provides a cross-sectional view of a step in the fabrication of a semiconductor device, according to an embodiment of the invention. The figure illustrates the device after the deposition of a bottom dielectric isolation material.

FIG. 31 illustrates an embodiment wherein dimensions b"is less than or equal to c", and c"is less than or equal to a", such that the void space fills completely with BDI material such that the horizontal portions of the void space completely fills with BDI material 3110. FIG. 32 illustrates an embodiment wherein dimension b"is less than or equal to a", which is in turn, less than c". In this embodiment, the b" cross section fills before the entire horizontal void space fills, resulting in the formation of the BDI including a plurality of individual airgaps 3210. FIG. 33 illustrates an embodiment wherein dimension a"is less than b", which is in turn, less than c". In this embodiment, the vertical gates fill before the entire horizontal void space fills, resulting in the formation of the BDI including a continuous airgap 3310 across the active region of the device.

Figure 34:
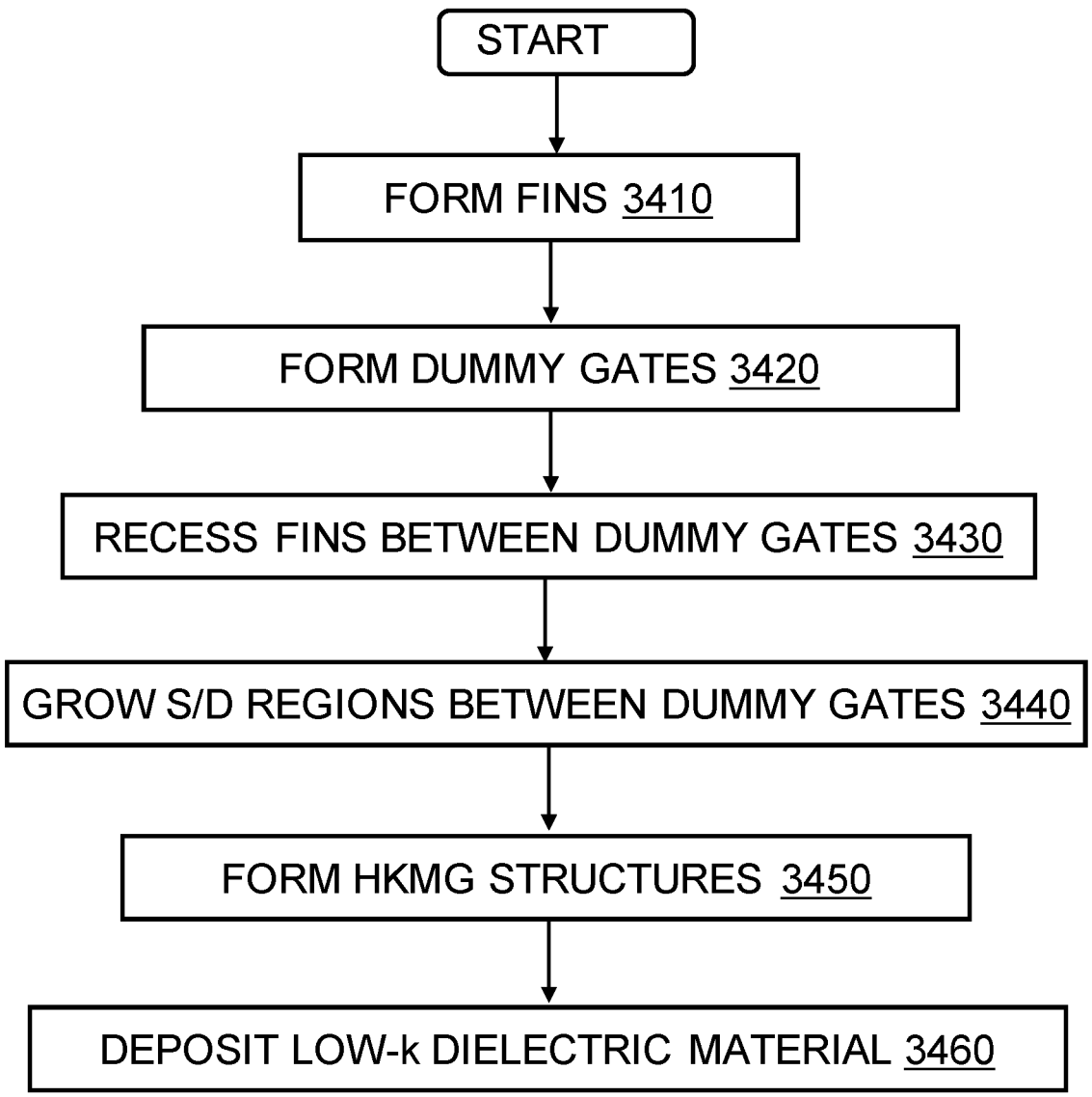
FIG. 34 provides a flowchart depicting operational steps for forming semiconductor device, according to an embodiment of the invention.

FIG. 34 provides flowchart 3400 listing steps associated with fabrication of semiconductor devices according to an embodiment of the invention. At block 3410, one or more fins are formed from semiconductor layers upon a substrate. The semiconductor layers including at least one sacrificial layer. The fin may include multiple stacked semiconductor nanosheets or a sacrificial layer and a single semiconductor layer disposed above the sacrificial layer.

At block 3420, a set of dummy gate structures including dummy gates and gate sidewall spacers are formed upon the fin.

At block 3430, recesses are formed between dummy gates, exposing portions of the sacrificial layer between the dummy gates.

At block 3440, source-drain regions are grown between the sacrificial layer portions and the semiconductor fins of the device. Epitaxial growth from the fins and the sacrificial layer enables straining the fins and epitaxially grown source-drain regions.

At block 3450, the dummy gates are replaced with high-k metal gate structures.

At block 3460, the sacrificial layer is replaced with a low-k dielectric material and/or dielectric stressor material which yields strained epitaxial source-drain and fin channel regions.

In an embodiment, fabricating a device includes epitaxially growing a nanosheet stack, forming fins, forming Dummy Gates and gate sidewall spacers, and over-recessing the fins to level within a sacrificial layer such as SiGe 45%. Further forming inner spacers between nanosheet channel layers, forming a buffer layer of intrinsic/doped semiconductor upon the exposed fin and sacrificial layer surfaces, forming strained source/drain epitaxy between the sacrificial layer and the fins, depositing inter-layer dielectric and planarizing. Further patterning and forming of sacrificial caps to protect tuck-under dummy gates, performing a first poly crystalline-silicon—pull and channel release, forming HKMG, recessing the gate metal and forming SAC cap and planarizing. Performing a second poly-crystalline silicon pull and dummy gate Oxide strip/STI recess and sacrificial SiGe 45% removal, enlarging the void by performing an optional Si trimming, forming Bottom Dielectric Isolation through the tuck-under gate cavities, and forming trench metal contact above the source-drain regions of the device.

In an embodiment, fabricating a device includes epitaxially growing a nanosheet stack, forming fins, forming Dummy Gates and gate sidewall spacers, and over-recessing the fins to level within a sacrificial layer such as SiGe 45%. Further forming inner spacers between nanosheet channel layers, forming a buffer layer of intrinsic/doped semiconductor upon the exposed fin and sacrificial layer surfaces, forming strained source/drain epitaxy between the sacrificial layer and the fins, depositing inter-layer dielectric and planarizing. Further patterning and forming of sacrificial caps to protect tuck-under dummy gates, performing a first poly crystalline-silicon—pull and channel release, forming HKMG, recessing the gate metal and forming SAC cap and planarizing. Performing a second poly-crystalline silicon pull and dummy gate oxide strip/STI recess and sacrificial SiGe 45% removal, enlarging the void by performing an optional Si trimming, forming Bottom Dielectric Isolation through the tuck-under gate cavities, and forming trench metal contacts above the source-drain regions of the device.

In an embodiment, a finFET device may be fabricated with the disclosed BDI structure of FIGS. 22*a*-33 including the over-etched regions between gate structures, the epitaxially grown buffer layer in the over etched regions and the full horizontal and vertical BDI region. In this embodiment, the horizontal BDI may be completely filled, may include a plurality of discrete air pockets, or may include a continuous air pocket across the active region of the device.

The flowchart and block diagrams in the figures illustrate the architecture, functionality, and operation of possible implementations of systems, methods, and device fabrication steps according to various embodiments of the present invention. In this regard, each block in the flowchart or block diagrams may represent a module, segment, or portion of instructions, which comprises one or more fabrication steps for manufacturing the specified device(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A field effect transistor (FET) device comprising:
   an active region, the active region comprising a plurality of field effect transistors, a first edge and a second edge disposed opposite the first edge;
   a dielectric isolation region disposed horizontally-beneath the active region and above an underlying semiconductor substrate, the dielectric isolation region further disposed vertically in gate diffusion break regions at the first edge and the second edge of the active region.

2. The FET device according to claim 1, wherein the dielectric isolation region is disposed vertically at two edges of the active region.

3. The FET device according to claim 1, wherein the dielectric isolation region comprises an air gap.

4. The FET device according to claim 3, wherein an air gap cross section corresponds to an aspect ratio of horizontal and vertical dielectric isolation portions.

5. The FET device according to claim 1, wherein the dielectric isolation region comprises a plurality of air gaps.

6. The FET device according to claim 1, further comprising a plurality of finFET devices.

7. The FET device according to claim 1, further comprising a plurality of gate-all-around devices.

8. The FET device according to claim 1 further comprising a stressed source-drain region disposed between the dielectric isolation region and a channel of the FET.

9. The FET according to claim 1, wherein the horizontal and vertical dielectric isolation regions comprise a continuous dielectric isolation region.

10. The FET according to claim 1, wherein the dielectric isolation region exhibits one of tensile or compressive stress properties.

* * * * *